(12) United States Patent
Stewart et al.

(10) Patent No.: US 11,887,640 B2
(45) Date of Patent: *Jan. 30, 2024

(54) VOLTAGE-CONTROLLED MAGNETIC ANISOTROPY MEMORY DEVICE INCLUDING AN ANISOTROPY-ENHANCING DUST LAYER AND METHODS FOR FORMING THE SAME

(71) Applicant: WESTERN DIGITAL TECHNOLOGIES, INC., San Jose, CA (US)

(72) Inventors: Derek Stewart, Livermore, CA (US); Alan Kalitsov, San Jose, CA (US); Bhagwati Prasad, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 277 days.

This patent is subject to a terminal disclaimer.

(21) Appl. No.: 17/341,119

(22) Filed: Jun. 7, 2021

(65) Prior Publication Data

US 2022/0392505 A1 Dec. 8, 2022

(51) Int. Cl.
*G11C 16/04* (2006.01)
*G11C 11/16* (2006.01)
(Continued)

(52) U.S. Cl.
CPC ........ *G11C 11/161* (2013.01); *G11C 11/1675* (2013.01); *H01F 10/3254* (2013.01);
(Continued)

(58) Field of Classification Search
CPC .............. G11C 11/161; G11C 11/1673; G11C 11/1675
See application file for complete search history.

(56) References Cited

U.S. PATENT DOCUMENTS 8,946,834 B2 2/2015 Wang et al.
8,981,505 B2 3/2015 Moriyama et al.
(Continued)

FOREIGN PATENT DOCUMENTS

WO WO 2014/022304 A1 2/2014
WO WO 2017/151735 A1 9/2017
(Continued)

OTHER PUBLICATIONS

U.S. Appl. No. 17/341,049, filed Jun. 2021, Stewart et al.*
(Continued)

*Primary Examiner* — Pho M Luu
(74) *Attorney, Agent, or Firm* — THE MARBURY LAW GROUP PLLC

(57) ABSTRACT

A magnetoelectric memory device includes a magnetic tunnel junction located between a first electrode and a second electrode. The magnetic tunnel junction includes a reference layer, a nonmagnetic tunnel barrier layer, a free layer, and a dielectric capping layer. At least one layer that provides voltage-controlled magnetic anisotropy is provided within the magnetic tunnel junction, which may include a pair of nonmagnetic metal dust layers located on, or within, the free layer, or a two-dimensional metal compound layer including a compound of a nonmagnetic metallic element and a nonmetallic element.

20 Claims, 26 Drawing Sheets

(51) Int. Cl.
  *H01F 10/32* (2006.01)
  *H10B 61/00* (2023.01)
  *H10N 50/10* (2023.01)
  *H10N 50/80* (2023.01)
  *H10N 50/85* (2023.01)
(52) U.S. Cl.
  CPC ..... *H01F 10/3272* (2013.01); *H01F 10/3286* (2013.01); *H10B 61/00* (2023.02); *H10N 50/10* (2023.02); *H10N 50/80* (2023.02); *H10N 50/85* (2023.02)

(56) References Cited

U.S. PATENT DOCUMENTS

| | | | |
|---|---|---|---|
| 9,159,907 | B2 | 10/2015 | Tang et al. |
| 9,177,575 | B1 | 11/2015 | Gao et al. |
| 9,396,742 | B1 | 7/2016 | Yang et al. |
| 10,354,710 | B2 | 7/2019 | Petti et al. |
| 10,580,966 | B1 | 3/2020 | Van der Straten et al. |
| 10,726,892 | B2 | 7/2020 | Le et al. |
| 10,788,547 | B2 | 9/2020 | Kalitsov et al. |
| 10,797,227 | B2 | 10/2020 | Le et al. |
| 10,811,596 | B2 | 10/2020 | Le et al. |
| 10,862,022 | B2 | 12/2020 | Le et al. |
| 10,991,407 | B1 | 4/2021 | Prasad et al. |
| 11,005,034 | B1* | 5/2021 | Prasad ................ H01F 10/3259 |
| 11,029,604 | B2 | 6/2021 | Ohtomi |
| 11,056,640 | B2* | 7/2021 | Prasad .................. H10N 50/01 |
| 2006/0174473 | A1 | 8/2006 | Oh et al. |
| 2011/0049659 | A1 | 3/2011 | Suzuki et al. |
| 2012/0218813 | A1 | 8/2012 | Oh et al. |
| 2012/0300542 | A1 | 11/2012 | Uchida et al. |
| 2013/0146996 | A1 | 6/2013 | Yu et al. |
| 2013/0249028 | A1 | 9/2013 | Kamata et al. |
| 2014/0306302 | A1 | 10/2014 | Jan et al. |
| 2015/0228891 | A1 | 8/2015 | Park et al. |
| 2015/0285957 | A1 | 10/2015 | Scherer |
| 2016/0351799 | A1 | 12/2016 | Xue et al. |
| 2017/0092842 | A1 | 3/2017 | Khalili Amiri et al. |
| 2017/0117027 | A1 | 4/2017 | Braganca et al. |
| 2017/0287979 | A1 | 10/2017 | Manipatruni et al. |
| 2017/0338403 | A1 | 11/2017 | Kim et al. |
| 2018/0277497 | A1 | 9/2018 | Matsuo |
| 2019/0027169 | A1 | 1/2019 | Xue et al. |
| 2019/0027201 | A1 | 1/2019 | Petti et al. |
| 2019/0080738 | A1 | 3/2019 | Choi et al. |
| 2019/0103553 | A1 | 4/2019 | Hong |
| 2019/0189908 | A1 | 6/2019 | Ebrahimi et al. |
| 2019/0221575 | A1 | 7/2019 | Dong et al. |
| 2019/0237661 | A1 | 8/2019 | Iwata et al. |
| 2020/0233047 | A1 | 7/2020 | Kalitsov et al. |
| 2021/0028148 | A1 | 1/2021 | Wu et al. |
| 2021/0126052 | A1* | 4/2021 | Wan ....................... H10N 50/80 |

FOREIGN PATENT DOCUMENTS

| | | |
|---|---|---|
| WO | WO 2018/004648 A1 | 1/2018 |
| WO | WO 2021101585 A1 | 5/2021 |

OTHER PUBLICATIONS

U.S. Appl. No. 17/341,090, filed Jun. 2021, Stewart et al.*
ISR—Notification of Transmittal of the International Search Report and Written Opinion of the International Searching Authority for International Patent Application No. PCT/US2022/013605, dated May 11, 2022, 12 pages.
Gonzalez-Fuentes, C. et al., "Theory of Ferromagnetic Resonance Driven by the Combined Action of Spin-Transfer Torque and Voltage-Controlled Magnetic Anisotropy," Phys. Rev. B 96, 174440—Published Nov. 27, 2017 (Abstract).
Notification of Transmittal of the International Search Report and Written Opinion of the International Search Authority for International Patent Application No. PCT/US2020/025989, dated Aug. 24, 2020, 17 pages.
Kalitsov, A. et al., "Spin-transfer torque in magnetic tunnel junctions," Phys. Rev. B. 79, 174416 (2009).
Nozaki, T. et al., "Highly Efficient Voltage Control of spin and Enhanced Interfacial Perpendicular Magnetic Anisotropy in Iridium-Doped Fe/MgO Magnetic Tunnel Junctions," NPG Asia Materials, vol. 9, e451, pp. 1-10, (2017); doi:10.1038/am.2017.204.
Robertson, J., "High Dielectric Constant Gate Oxides for Metal Oxide Si Transistors," Rep. Prog. Phys., vol. 69, (2006).
Kwon, S. et al., "Colossal electric field control of magnetic anisotropy at ferromagnetic interfaces induced by iridium overlayer," Phys. Rev. B. Solid State, vol. 99, No. 6, 064434, (2019). DOI:10.1103/PhysRevB.99.064434.
C2DB—Computational 2D material data base, https://cmrdb.lysik.dlu.dk/c2db/ (visited Jun. 8, 2021).
U.S. Appl. No. 16/693,006, filed Nov. 22, 2019, Western Digital Technologies, Inc.
U.S. Appl. No. 17/203,420, filed Mar. 16, 2021, Western Digital Technologies, Inc.
U.S. Appl. No. 17/210,919, filed Mar. 24, 2021, Western Digital Technologies, Inc.
U.S. Appl. No. 17/210,936, filed Mar. 24, 2021, Western Digital Technologies, Inc.
U.S. Appl. No. 17/341,049, filed Jun. 7, 2021, Western Digital Technologies, Inc.
U.S. Appl. No. 17/341,090, filed Jun. 7, 2021, Western Digital Technologies, Inc.
Ahn, C. et al., "Energy-Efficient Phase-Change Memory with Graphene as a Thermal Barrier," American Chemical Society, Nano Lett., vol. 15, pp. 6809-6814, (2015); DOI: 10.1021/acs.nanolett.5b02661.
Hamalainen, J. et al., "Atomic Layer Deposition of Iridium Oxide Thin Films from Ir(acac)3 and Ozone," Chem. Mater., vol. 20, No. 9, pp. 2903-2907, (2008); DOI: 10.1021/cm7030224.
Huang, L. et al., "Graphene/Si CMOS Hybrid Hall Integrated Circuits," Scientific Reports, vol. 4, : 5548, (2014); DOI: 10.1038/srep05548.
Kwon, S. et al., "Voltage-Controlled Magnetic Anisotropy in Heterostructures with Atomically Thin Heavy Metals," Phys. Rev. Applied, vol. 12, Issue 4, pp. 044075-1-044075-6, (2019); DOI: 10.1103/PhysRevApplied.12.044075.
Popis, M. D. et al., "Study of iridium silicide monolayers using density functional theory," J. Appl. Phys., vol. 123, pp. 074301-1-074301-9 (2018); https://doi.org/10.1063/1.5010331.
Yang, P. et al., "Epitaxial Growth of Centimeter-Scale Single-Crystal MoS 2 Monolayer on Au(111)," ACS Nano., vol. 14, No. 4, pp. 5036-5045, (2020); DOI: 10.1021/acsnano.0c01478. Epub Apr. 13, 2020. PMID: 32267670.
Kalitsov, A. et al., "Magnetoresistive Memory Device Including a Plurality of Reference Layers," U.S. Appl. No. 17/358,990, filed Jun. 25, 2021.

* cited by examiner

VOLTAGE-CONTROLLED MAGNETIC ANISOTROPY MEMORY DEVICE INCLUDING AN ANISOTROPY-ENHANCING DUST LAYER AND METHODS FOR FORMING THE SAME

FIELD

The present disclosure relates generally to the field of magnetic memory devices and specifically to magnetoelectric random access memory (MeRAM) voltage-controlled magnetic anisotropy memory devices including a dust or two-dimensional layer that enhances voltage-controlled magnetic anisotropy and methods for forming the same.

BACKGROUND

Voltage-controlled magnetic anisotropy (VCMA) refers to magnetic anisotropy that increase or decreases with application of an electric field across a magnetic tunnel junction. A VCMA memory cell can be programmed employing the voltage-controlled magnetic anisotropy (VCMA) effect. Thus, the memory cell can be programmed employing an electrical voltage that is applied in one direction. In other words, a voltage is applied between a selected word line and a selected bit line, and the memory cell can be toggled back and forth between the parallel and anti-parallel states by pulsing a voltage in one direction (e.g., in forward bias mode). In one embodiment, a very small current may flow between the free layer and the reference layer of the magnetic tunnel junction during the writing step. However, the current is typically so small that spin-transfer torque (STT) effects can be ignored.

SUMMARY

According to an embodiment of the present disclosure, a magnetoelectric memory device is provided, which comprises: a first electrode; a second electrode; and a magnetic tunnel junction located between the first electrode and the second electrode, the magnetic tunnel junction comprising, from a side of the first electrode toward the second electrode, a first reference layer, a nonmagnetic tunnel barrier layer, a first nonmagnetic metal dust layer, a free layer, and a second nonmagnetic metal dust layer; and a dielectric capping layer located between the magnetic tunnel junction and the second electrode, wherein the first nonmagnetic metal dust layer and the second nonmagnetic metal dust layer have opposite signs of a voltage-controlled magnetic anisotropy coefficient.

According to another aspect of the present disclosure, a magnetoelectric memory device is provided, which comprises: a first electrode; a second electrode; and a magnetic tunnel junction located between the first electrode and the second electrode, the magnetic tunnel junction comprising, along a direction from the first electrode toward the second electrode, a first reference layer, a nonmagnetic tunnel barrier layer, a first nonmagnetic metal dust layer, a free layer including a first component free layer and a second component free layer that are spaced from each other by a second nonmagnetic metal dust layer; and a dielectric capping layer.

According to yet another aspect of the present disclosure, a magnetoelectric memory device is provided, which comprises: a first electrode; a second electrode; and a magnetic tunnel junction located between the first electrode and the second electrode, the magnetic tunnel junction comprising, along a direction from the first electrode toward the second electrode, a first reference layer, a nonmagnetic tunnel barrier layer, and a free layer; and a dielectric capping layer located between the magnetic tunnel junction and the second electrode, wherein a two-dimensional metal compound layer including a two-dimensional compound of a nonmagnetic metallic element and a nonmetallic element having in-plane covalent bonding and out-of-plane van der Waals bonding is embedded within the free layer or is located between the nonmagnetic tunnel barrier layer and the free layer. The metal compound layer may be electrically conductive or electrically insulating.

DETAILED DESCRIPTION

Figure 1:
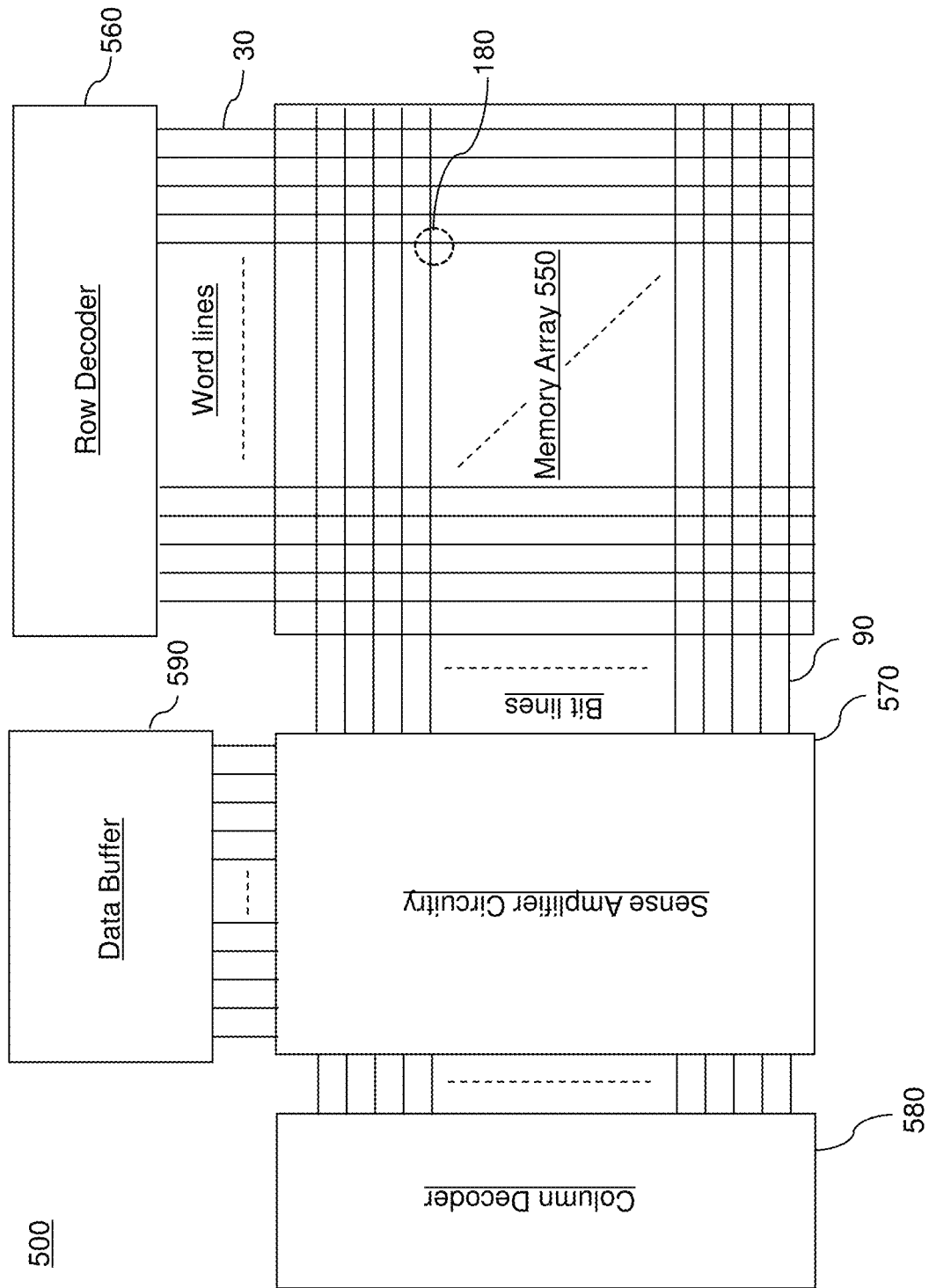
FIG. 1 is a schematic diagram of a memory device including an array of magnetoelectric memory cells according to an embodiment of the present disclosure.

As discussed above, the present disclosure is directed to voltage-controlled magnetic anisotropy memory devices including one or more dust (i.e., dusting) or two-dimensional layers that enhance voltage-controlled magnetic anisotropy and methods for forming the same, the various aspects of which are described below.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" refers to a layer that has a predominant direction of extension, i.e., having a direction along which the layer extends the most.

Performance improvement of magnetic tunnel junction devices can be provided by increasing tunneling magnetoresistance ratio (TMR) to provide a higher signal-to-noise ratio during the reading step, by increasing thermal stability of magnetization direction through an increase in the perpendicular magnetic anisotropy (PMA) to store written information, and/or by providing energy-efficient switching methods. Increasing the voltage-controlled magnetic anisotropy (VCMA) can be an energy efficient way to manipulate the magnetization of the free layer. The VCMA coefficient of the device should sufficiently high so that the magnetization direction of a free layer can be switched at a reasonably low external voltage.

According to an aspect of the present disclosure, a heavy nonmagnetic metal element can be inserted close to an interface between the free layer and the tunnel barrier layer to form a nonmagnetic metal dust layer that enhances the VCMA coefficient of the MeRAM device. According to an embodiment of the present disclosure, two metal dust layers including different heavy metals with opposite signs of VCMA coefficients can be formed on opposite surfaces of a free layer. In other words, one metal dust layer can provide a positive VCMA coefficient, and the other metal dust layer can provide a negative VCMA coefficient. Because the two metal dust layers are located on opposite sides of the free layer, the net VCMA coefficient for an external electric field applied across the free layer for the two metal dust layers constructively adds up during operation of the embodiment MeRAM device. Thus, the VCMA contribution from both free layer interfaces would contribute to the VCMA with the same sign and therefore enhance the overall VCMA coefficient.

According to another embodiment of the present disclosure, a first metal dust layer can be formed between the free layer and the nonmagnetic tunnel barrier layer, and a second metal dust layer can be formed within the free layer. The first metal dust layer and the second metal dust layer may comprise the same metal or similar metals with the same sign of the VCMA coefficient. The insertion of the heavy metal dust layers at different distances from the interface between the free layer and the tunnel barrier layer enhance the overall VCMA coefficient of the MeRAM device.

According to another embodiment of the present disclosure, a two-dimensional material providing strong covalent bonds in-plane and weak van der Waals interactions perpendicular to the plane can be employed as a stable two-dimensional metal compound layer that increases the VCMA coefficient and long term endurance of the MeRAM device. The two-dimensional metal compound layer can be located at an interface between the free layer and the tunnel barrier layer, or may be located within the free layer in proximity to the interface between free layer and the tunnel barrier layer. The various embodiments of the present disclosure are now described in detail with reference to accompanying drawings.

Referring to FIG. 1, a schematic diagram is shown for a magnetoelectric random access memory (RAM) device 500 including memory cells 180 of any embodiment of the present disclosure in an array configuration. The RAM device 500 includes an array of memory cells 180, which may be configured as a two-dimensional array or as a three-dimensional array. As used herein, a "random access memory" (RAM) refers to a memory device containing memory cells that allow random access, e.g., access to any selected memory cell upon a command for reading the contents of the selected memory cell. The RAM device 500 of the embodiment of the present disclosure is a random access memory device including a magnetoelectric memory element within each memory cell.

The RAM device 500 of an embodiment of the present disclosure includes a memory array region 550 containing an array of memory cells 180 located at the intersection of the respective word lines (which may comprise electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). Each of the memory cells 180 can be a two terminal memory cell including a respective first electrode and a respective second electrode. In one embodiment, the first electrodes can be connected to the first electrically conductive lines 30, and the second electrodes can be connected to the second electrically conductive lines 90. Alternatively, the first electrodes can be connected to the second electrically conductive lines 90, and the first electrodes can be connected to the first electrically conductive lines 30.

The RAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the memory cells 180 are provided in an array configuration that forms the RAM device 500. It should be noted that the location and interconnection of elements are schematic and the elements may be arranged in a different configuration. Further, a memory cell 180 may be manufactured as a discrete device, i.e., a single isolated device.

Each memory cell 180 includes a magnetic tunnel junction having at least two different resistive states depending on the alignment of magnetizations of different magnetic material layers. The magnetic tunnel junction is provided between a first electrode and a second electrode within each memory cell 180 In the first and second embodiments, the RAM device 500 comprises a VCMA magnetoelectric RAM ("MeRAM") device, and each memory cell 180 can be a voltage-controlled magnetic anisotropy (VCMA) magnetoelectric memory cell in which the magnetization of the free layer can be controlled by an applied voltage. The magnetization may be programmed non-deterministically by timing the duration of a unipolar voltage pulse that induces precession in the free layer, and stopping the voltage pulse when the desired magnetization direction is achieved during the precession.

Figure 2:
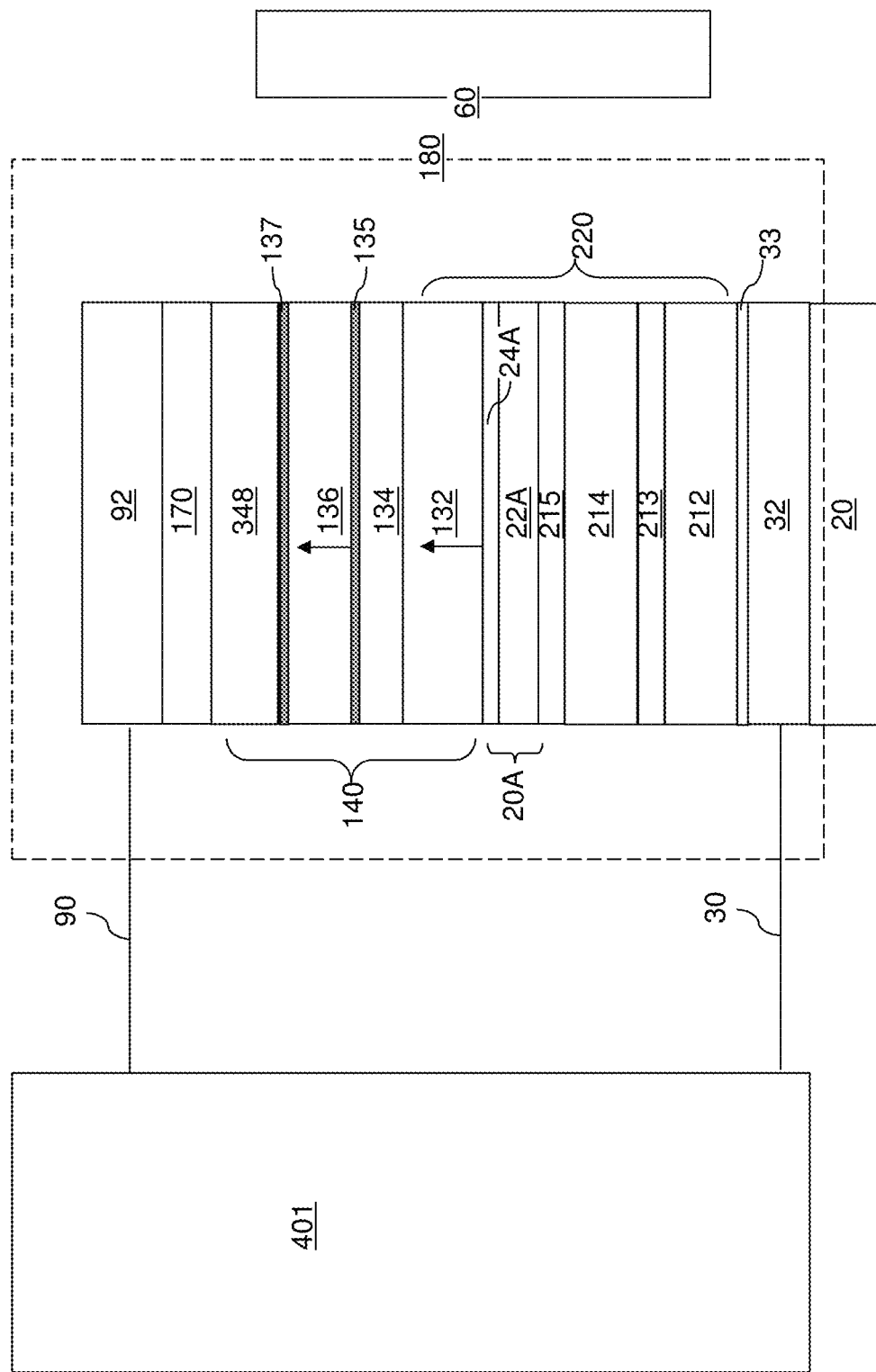
FIG. 2 illustrates a first configuration of a first exemplary voltage-controlled magnetic anisotropy (VCMA) memory device according to a first embodiment of the present disclosure.

Referring to FIG. 2, a first configuration of a first exemplary magnetoelectric memory device according to a first embodiment of the present disclosure is illustrated, which comprises a magnetoelectric memory cell. The magnetoelectric memory cell may be employed as a memory cell 180 within the MeRAM device 500 illustrated in FIG. 1. According to the embodiment of the present disclosure, the magnetoelectric memory cell of the first embodiment of the present disclosure may be a voltage-controlled magnetic anisotropy (VCMA) magnetoelectric memory cell. The memory cell 180 can be formed on an insulating support 20 (which may include a silicon oxide layer), and can include a first electrode 32 that may be electrically connected to, or comprises, a portion of a first electrically conductive line 30 (such as a word line or a bit line) and a second electrode 92 that may be electrically connected to, or comprises, a portion of a second electrically conductive line 90 (such as a bit line or a word line).

A magnetic tunnel junction (MTJ) 140, a dielectric capping layer 348, and a nonmagnetic metallic capping layer 170 may be formed in a forward order or in a reverse order between the first electrode 32 and the second electrode 92. In one embodiment, a first reference layer 132 may be provided as a component within a first composite reference magnetization structure 220, which may include a composite superlattice SAF structure, which is described below in detail.

Optionally, a metallic seed layer 33 may be deposited directly on a top surface of the first electrode 32. The metallic seed layer 33 may include one or more of Ta, Ti, V, Cr, Mn, Zr, Nb, Mo, Pt, Ru, Rh, Hf, W, Re, Os, or Ir. In one embodiment, the metallic seed layer 33 can include tantalum and/or platinum. The metallic seed layer 33 can be deposited, for example, by sputtering. The metallic seed layer 33 can have a thickness in a range from 2 nm to 10 nm, although lesser and greater thicknesses may also be employed.

The magnetic tunnel junction 140 includes a first reference layer 132 (which may also be referred to as a "pinned" layer) having a fixed vertical magnetization, a nonmagnetic tunnel barrier layer 134, and the free layer 136 (which may also be referred to as a "storage" layer) having a magnetization direction that can be programmed. The first reference layer 132 and the free layer 136 can be separated by the nonmagnetic tunnel barrier layer 134 (such as an MgO layer), and have a magnetization direction perpendicular to the interface between the free layer 136 and the nonmagnetic tunnel barrier layer 134.

In one embodiment, the first reference layer 132 is located below the nonmagnetic tunnel barrier layer 134, while the free layer 136 is located above the nonmagnetic tunnel barrier layer 134. A dielectric capping layer 348 may be formed on top of the free layer 136. However, in other embodiments, the first reference layer 132 is located above the nonmagnetic tunnel barrier layer 134, while the free layer 136 is located below the nonmagnetic tunnel barrier layer 134, or the first reference layer 132 and the free layer 136 may be located on opposite sides of the nonmagnetic tunnel barrier layer 134. The free layer 136 may be programmed into a first magnetization (e.g., magnetization direction) that is parallel to the fixed vertical magnetization (e.g., magnetization direction) of the first reference layer 132, and a second magnetization (e.g., magnetization direction) that is antiparallel to the fixed vertical magnetization (e.g., magnetization direction) of the first reference layer 132.

The first reference layer 132 can include either a Co/Ni or Co/Pt multilayer structure or any other material that have larger perpendicular magnetic anisotropy than the free layer 136. In one embodiment, the first reference layer 132 can additionally include a thin non-magnetic layer comprised of tantalum or tungsten having a thickness in a range from 0.2 nm to 0.5 nm and a thin CoFeB layer (having a thickness in a range from 0.5 nm to 3 nm). The first reference layer 132 has a fixed magnetization direction that does not change during operation of the memory cell 180. The fixed magnetization direction may be an upward direction or may be a downward direction.

The nonmagnetic tunnel barrier layer 134 can include any tunneling barrier material such as an electrically insulating material, for example magnesium oxide or a magnesium aluminum oxide spinel. In one embodiment, the nonmagnetic tunnel barrier layer 134 comprises, and/or consists essentially of, magnesium oxide and has a thickness in a range from 0.5 nm to 1.5 nm, such as from 0.8 nm to 1 nm.

The free layer 136 includes a ferromagnetic material such as CoFeB, CoFe, Co, Ni, NiFe, or a combination thereof. If a CoFeB alloy is included in the free layer 136, then the atomic concentration of boron atoms within the CoFeB alloy may be in a range from 10% to 30% (such as 20%), the atomic concentration of cobalt atoms within the CoFeB alloy may be in a range from 10% to 40% (such as 15%), and the atomic concentration of Fe in the CoFeB layer may be in a range from 50% to 90% (such as 65%). Any impurity atom in the CoFeB alloy, if present, has an atomic concentration less than 1 parts per million. The CoFeB alloy may be deposited in the amorphous state on a crystalline MgO nonmagnetic tunnel barrier layer 134 which has a rocksalt crystal structure. During a subsequent anneal of the device, the CoFeB alloy crystallizes into a body-centered cubic crystal structure using the MgO layer as a crystallization template, while some or all of the boron atoms diffuse away from the interface with the MgO layer. Thus, a proximal portion of the free layer 136 that contacts the nonmagnetic tunnel barrier layer 134 may comprise a CoFe alloy or a CoFeB alloy having a body-centered cubic crystal structure, and may provide a coherent interface with the nonmagnetic tunnel barrier layer 134, particularly with MgO and a higher TMR. The thickness of the free layer 136 can be in a range from 0.5 nm to 2 nm, although lesser and greater thicknesses can also be employed.

As used herein, a "thickness" of any deposited film having a thickness less than 10 nm is the product of the deposition time and the deposition rate as measured by deposition of a thicker film that can be physically measured by optical methods or by scanning electron microscopy. The deposition rate can be calibrated independently on thicker films for each material. A single monolayer of a material has an equivalent thickness of the monolayer of the material. A material that forms a fraction of a monolayer has an equivalent thickness of the fraction times the thickness of the monolayer of the material. If the fraction is less than one, then the material is a discontinuous layer in which the equivalent thickness can be less than the thickness of the monolayer of the material. As used herein, a "sub-monolayer" refers to a film having an average thickness less than one monolayer (e.g., less than 0.5 nm thick). In embodiments of the present disclosure, a sub-monolayer film can be a discontinuous layer having openings therethrough or can be a collection of individual atoms or clusters of atoms that do not form a continuous layer depending on the fractional number of an atomic layer that is present therein.

An interface between a magnetic film and a nonmagnetic film can be magnetoelectric, i.e., can exhibit a magnetic property that is sensitive to the electric field in the nonmagnetic film. When some dielectric materials are in contact with, or in close proximity with, a ferromagnetic material, may cause the ferromagnetic material to exhibit the voltage-controlled magnetic anisotropy (VCMA) effect within the ferromagnetic material. The VCMA effect refers to an effect in which the magnetic anisotropy of a ferromagnetic material depends on the electric field within a dielectric material in direct contact with, or in close proximity to, the ferromagnetic material. Generally, the VCMA effect is believed to be due to spin-dependent charge screening and electric field-induced modulation of the relative occupancy of d orbitals at an interface between a ferromagnetic material and a dielectric material.

In one embodiment, a dielectric capping layer 348 can be formed over the free layer 136. In one configuration of the first embodiment, a dust layer 137 is located between the dielectric capping layer 348 and the free layer 136, as will be described in more detail below. In other embodiments, the dielectric capping layer 348 is deposited directly on the free layer 136 and directly physically contacts the free layer 136 without any intervening layer in between. The dielectric capping layer 348 is a dielectric material layer that decreases the magnetic anisotropy in the free layer 136 when electric field is present therein along a direction perpendicular to an interface with the free layer 136. In one embodiment, the dielectric capping layer 348 has a dielectric constant of greater than 10, such as 25 or more, such as 25 to 80,000, for example 25 to 150, to enhance the VCMA effect in the memory cell 180. The thickness of the dielectric capping layer 348 can be in a range from 1 nm to 10 nm, such as from 1.5 nm to 3 nm.

Preferably, the dielectric capping layer 348 is thicker than the nonmagnetic tunnel barrier layer 134, and may have the same or a higher dielectric constant than the nonmagnetic tunnel barrier layer 134. This shifts the VCMA effect which controls the magnetization direction of the free layer from the interface between the free layer 136 and the nonmagnetic tunnel barrier layer 134 to the interface between the free layer 136 and the dielectric capping layer 348. Thus, the TMR of the memory cell 180 may be maintained because the interface between the free layer 136 and the nonmagnetic tunnel barrier layer 134 is not degraded, while the VCMA effect in enhanced due to the higher dielectric constant of the dielectric capping layer 348.

In one embodiment, the dielectric material of the dielectric capping layer 348 includes a dielectric material having a dielectric constant of 10 or greater, such as 25 or greater, when having a thickness of 10 nm or less, such as 1 nm to 5 nm. While many dielectric materials provide a dielectric constant greater than 10 in a bulk state, some dielectric materials have a lower or higher dielectric constant in a thin film having a thickness of 10 nm or less. In one embodiment, the dielectric material of the dielectric capping layer 348 can be selected such that the dielectric material has a dielectric constant is 10 or greater when the dielectric capping layer 348 a thickness of 10 nm or less, such as a thickness in range from 1 nm to 5 nm.

In one embodiment, the dielectric material of the dielectric capping layer 348 can include, and/or can consist essentially of at least one transition-metal-containing dielectric metal oxide material, such as magnesium oxide, hafnium oxide or a magnesium aluminum oxide spinel. In an alternative embodiment, the dielectric material of the dielectric capping layer 348 can comprise, and/or can consist essentially of, a material that has a dielectric constant of 25 and higher, such strontium titanate, barium titanate, barium strontium titanate, lead zirconate titanate, lead lanthanum titanate, lead lanthanum titanate zirconate, lead lanthanum zirconate, bismuth ferrite or calcium copper titanate (which is reported to have a dielectric constant of about 80,000).

In one embodiment, the voltage drop across the dielectric capping layer 348 can be greater than the voltage drop across the nonmagnetic tunnel barrier layer 134 during programming, i.e., writing. Ignoring the effect of the nonmagnetic tunneling current, the ratio of the voltage drop across the dielectric capping layer 348 to the voltage drop across the nonmagnetic tunnel barrier layer 134 is approximately the same as the ratio of the thickness-to-dielectric constant ratio for the dielectric capping layer 348 to the thickness-to-dielectric constant ratio for the nonmagnetic tunnel barrier layer 134. A thickness-to-dielectric constant ratio refers to the ratio of the thickness of a dielectric layer to the dielectric constant of the dielectric layer. Thus, the thickness-to-dielectric constant ratio for the dielectric capping layer 348 can be greater than the thickness-to-dielectric constant ratio for the nonmagnetic tunnel barrier layer 134.

According to an embodiment of the present disclosure, the magnetic tunnel junction 140 may comprise, from a side of the first electrode 32 toward the second electrode 92, the first reference layer 132, the nonmagnetic tunnel barrier layer 134, a first nonmagnetic metal dust layer 135, the free layer 136, a second nonmagnetic metal dust layer 137, and the dielectric capping layer 348. The first nonmagnetic metal dust layer 135 and the second nonmagnetic metal dust layer 137 provide voltage-controlled magnetic anisotropy coefficients of a same polarity for the free layer 136. A voltage-controlled magnetic anisotropy coefficient refers to the ratio of an increase in the magnetic anisotropy energy per volume to the applied external electric field across a magnetic tunnel junction.

As used herein, a dust layer refers to a continuous layer or a non-continuous layer formed by deposition of at least one metal (e.g., nonmagnetic elemental metal) such that the thickness of the deposited metal does not exceed the thickness of five monolayers of the metal. In one embodiment, the dust layer may be a non-continuous, sub-monolayer film having an effective thickness of less than one monolayer. Each of the first nonmagnetic metal dust layer 135 and the second nonmagnetic metal dust layer 137 can be deposited, for example, by physical vapor deposition of at least one nonmagnetic elemental metal. Each of the first nonmagnetic metal dust layer 135 and the second nonmagnetic metal dust layer 137 can consist essentially of at least one elemental metal, i.e., a metallic element in an elemental form.

The thickness and the material of each of the first nonmagnetic metal dust layer 135 and the second nonmagnetic metal dust layer 137 can be selected such that each of the first nonmagnetic metal dust layer 135 and the second nonmagnetic metal dust layer 137 have opposite signs of VCMA coefficients and are located on opposite surfaces of the free layer 137. In other words, one metal dust layer can provide a positive VCMA coefficient, and the other metal dust layer can provide a negative VCMA coefficient. Because the two metal dust layers (135, 137) are located on opposite sides of the free layer 136, the net VCMA coefficient for an external electric field applied across the free layer 136 for the two metal dust layers constructively adds up during operation of the embodiment MeRAM device. Thus, the VCMA contribution from both free layer 136 interfaces contributes to the VCMA with the same sign and therefore enhance the overall VCMA coefficient.

In one embodiment, each of the first nonmagnetic metal dust layer 135 and the second nonmagnetic metal dust layer 137 consists essentially of respective at least one elemental metal. Each of the at least one elemental metal can be selected from Jr, Mg, Pd, Pt, W, Ta, Hf, Ru, or Rh such that the first nonmagnetic metal dust layer 135 and the second nonmagnetic metal dust layer 137 include different metals. Alternatively, the first nonmagnetic metal dust layer 135 and the second nonmagnetic metal dust layer 137 may comprise an alloy, such as a Mg—Al alloy. In one embodiment, the first nonmagnetic metal dust layer 135 consists essentially of iridium, and the second nonmagnetic metal dust layer 137 consists essentially of platinum.

Each of the first nonmagnetic metal dust layer 135 and the second nonmagnetic metal dust layer 137 may be formed by physical vapor deposition (i.e., sputtering). The thickness of each of the first nonmagnetic metal dust layer 135 and the second nonmagnetic metal dust layer 137 can be less than 5 monolayers of the at least one elemental metal. In one embodiment, the thickness of each of the first nonmagnetic metal dust layer 135 and the second nonmagnetic metal dust layer 137 can be in a range from 0.1 nm to 1.2 nm, such as from 0.1 nm to 0.8 nm, and/or from 0.2 nm to 0.5 nm. In one embodiment, one, or both, of the first nonmagnetic metal dust layer 135 and the second nonmagnetic metal dust layer 137 has a sub-monolayer thickness and includes openings therethrough. In one embodiment, one, or both, of the first nonmagnetic metal dust layer 135 and the second nonmagnetic metal dust layer 137 is discontinuous, i.e., includes multiple clusters that do not contact one another. The number of metal atoms in each cluster may be in a range from 1 to 100. In this case, the effective thickness of one, or both, of the first nonmagnetic metal dust layer 135 and the second nonmagnetic metal dust layer 137 may be in a range from 0.1 nm to 0.2 nm. Alternatively, one, or both, of the first nonmagnetic metal dust layer 135 and the second nonmagnetic metal dust layer 137 can have a thickness in a range from 1 monolayer of the at least one elemental metal and 5 monolayers of the at least one elemental metal.

In one embodiment, the first nonmagnetic metal dust layer 135 comprises an iridium layer having a thickness in a range from 0.1 monolayer of iridium to 2 monolayers of iridium; and the second nonmagnetic metal dust layer 137 comprises a platinum layer having a thickness in a range from 0.1 monolayer of platinum to 2 monolayers of platinum.

In another embodiment, the first nonmagnetic metal dust layer 135 comprises a platinum layer having a thickness in a range from 0.1 monolayer of iridium to 2 monolayers of platinum; and the second nonmagnetic metal dust layer 137 comprises an iridium layer having a thickness in a range from 0.1 monolayer of platinum to 2 monolayers of iridium.

In one embodiment, the first nonmagnetic metal dust layer 135 and the second nonmagnetic metal dust layer 137 consist essentially of a respective single nonmagnetic metallic element. In one embodiment, each of the nonmagnetic tunnel barrier layer 134 and the dielectric capping layer 348 comprises, and/or consists essentially of, a respective material selected from magnesium oxide or magnesium aluminum oxide spinel material. In one embodiment, the thickness-to-dielectric constant ratio for the dielectric capping layer 348 can be greater than the thickness-to-dielectric constant ratio for the nonmagnetic tunnel barrier layer 134.

In one embodiment, a nonmagnetic metallic material can be provided on the side of the dielectric capping layer 348 that faces away from the free layer 136. For example, a nonmagnetic metallic capping layer 170 can be formed directly on the dielectric capping layer 348. The nonmagnetic metallic capping layer 170 includes at least one nonmagnetic electrically conductive material such as tantalum, ruthenium, tantalum nitride, copper, and/or copper nitride. For example, the nonmagnetic metallic capping layer 170 can comprise a single layer, such as a single ruthenium layer, or a layer stack including, from one side to another, a first ruthenium layer, a tantalum layer, and a second ruthenium layer. For example, the first ruthenium layer can have a thickness in a range from 0.5 nm to 1.5 nm, the tantalum layer can have a thickness in a range from 1 nm to 3 nm, and the second ruthenium layer can have a thickness in a range from 0.5 nm to 1.5 nm. Optionally, the nonmagnetic metallic capping layer 170 may include an additional non-magnetic electrically conductive material, such as W, Ti, Ta, WN, TiN, TaN, Ru, and Cu. The thickness of such an additional non-magnetic electrically conductive material can be in a range from 1 nm to 30 nm, although lesser and greater thicknesses can also be employed.

In one embodiment, the second electrode 92 can be formed over the nonmagnetic metallic capping layer 170 as a portion of a second electrically conductive line 90. In this case, the nonmagnetic metallic capping layer 170 may contact the dielectric capping layer 348 and the second electrode 92.

In one embodiment, the first nonmagnetic metal dust layer 135 provides a first voltage-controlled magnetic anisotropy coefficient to the free layer 136; the second nonmagnetic metal dust layer 137 provides a second voltage-controlled magnetic anisotropy coefficient to the free layer 136; and a magnitude of the second voltage-controlled magnetic anisotropy coefficient is at least 25% of a magnitude of the first voltage-controlled magnetic anisotropy coefficient. In one embodiment, the first voltage-controlled magnetic anisotropy coefficient has a magnitude greater than 2,400 fJ/V·m; and the second voltage-controlled magnetic anisotropy coefficient has a magnitude greater than 800 fJ/V·m based on ab initio calculations at zero degrees Kelvin. The actual magnitudes would be lower at temperatures above zero degrees Kelvin and due to defects, interface quality, heavy element diffusion, etc. Thus, the first voltage-controlled magnetic anisotropy coefficient has a magnitude up to 2,400 fJ/V·m; and the second voltage-controlled magnetic anisotropy coefficient has a magnitude up to 800 fJ/V·m above zero degrees Kelvin.

In one embodiment, at least one of the first nonmagnetic metal dust layer 135 and the second nonmagnetic metal dust layer 137 has a sub-monolayer thickness; and the at least one of the first nonmagnetic metal dust layer 135 and the second nonmagnetic metal dust layer 137 includes openings therethrough or includes multiple clusters that do not contact one another.

In one embodiment, the composite reference magnetization structure 220 may include the first reference layer 132 and a fixed vertical magnetization structure (212, 213, 214). The fixed vertical magnetization structure may comprise a composite synthetic antiferromagnet (SAF) structure including a first superlattice 212, a second superlattice 214, and an antiferromagnetic coupling layer 213 having a thickness that provides antiferromagnetic coupling between the first superlattice 212 and the second superlattice 214. In one embodiment, the first superlattice comprises a first superlattice of first cobalt layers and first platinum layers, and the second superlattice 214 comprises a second superlattice of second cobalt layers and second platinum layers. In one embodiment, the first superlattice 212 comprises N1 repetitions of a first unit layer stack of a first cobalt layer and a first platinum layer, and a first capping cobalt layer such that N1 first platinum layers are interlaced with (N1+1) first cobalt layers. The integer N1 may be in a range from 2 to 10, such as from 3 to 6, although lesser and greater numbers may also be employed for N1. In one embodiment, the second superlattice 214 comprises N2 repetitions of a second unit layer stack of a second cobalt layer and a second platinum layer, and a second capping cobalt layer such that N2 first platinum layers are interlaced with (N2+1) second cobalt layers. The integer N2 may be in a range from 2 to 10, such as from 3 to 6, although lesser and greater numbers may also be employed for N2. In an illustrative example, the first cobalt layers and the second cobalt layers may have a respective thickness of 0.2 nm to 0.5 nm, and the first platinum layers and the second platinum layers may have a respective thickness of about 0.1 nm to 0.3 nm. It is understood that a material layer having a thickness that is less than the thickness of a monolayer refers to a discontinuous layer having a fractional coverage that is equal to the ratio of the thickness of the material layer to the thickness of the monolayer.

The antiferromagnetic coupling layer 213 comprises a material composition and a thickness that provide antiferromagnetic coupling between the first permanent ferromagnetic layer 212 and the second permanent ferromagnetic layer 214. In one embodiment, the antiferromagnetic coupling layer 213 can include ruthenium or iridium, and can have a thickness in a range from 0.3 nm to 0.8 nm.

In one embodiment, the composite reference magnetization structure 220 may also include a first nonmagnetic spacer metal layer 215, which may be optionally located on a planar top surface of the fixed vertical magnetization structure (212, 213, 214). The first nonmagnetic spacer metal layer 215 can comprise, and/or consist essentially of, at least one refractory metal having a melting point higher than 2,000 degrees Celsius. For example, the first nonmagnetic spacer metal layer 215 can comprise, and/or consist essentially of, at least one metal selected from W, Mo or Ta. The thickness of the first nonmagnetic spacer metal layer 215 may be in a range from 0.1 nm to 0.3 nm, such as from 0.15 nm to 0.25 nm, although lesser and greater thicknesses may also be employed. The first nonmagnetic spacer metal layer 215 may be deposited, for example, by physical vapor deposition. In one embodiment, the first nonmagnetic spacer metal layer 215 may consist essentially of tungsten.

In one embodiment, the composite reference magnetization structure 220 may also include an optional second reference layer stack 20A which may be located between the first nonmagnetic spacer metal layer 215 and the first reference layer 132. The second reference layer stack 20A comprises a second reference layer 22A including a respective ferromagnetic material having perpendicular magnetic anisotropy, and a spacer dielectric metal oxide layer 24A.

The layer stack including the first composite reference magnetization structure 220, the magnetic tunnel junction 140, the dielectric capping layer 348, and the nonmagnetic metallic capping layer 170 can be annealed to induce crystallographic alignment between the crystalline structure of the nonmagnetic tunnel barrier layer 134 (which may include crystalline MgO having a rock salt crystal structure) and the crystalline structure of the free layer 136.

The location of the first electrode 32 and the second electrode 92 may be switched such that the second electrode 92 is electrically connected to the first composite reference magnetization structure 220 and the first electrode 32 is electrically connected to the nonmagnetic metallic capping layer 170. The layer stack including the material layers from the first composite reference magnetization structure 220 to the nonmagnetic metallic capping layer 170 can be deposited in reverse order, i.e., from the first composite reference magnetization structure 220 toward the nonmagnetic metallic capping layer 170 or from the nonmagnetic metallic capping layer 170 toward the first composite reference magnetization structure 220. The layer stack can be formed as a stack of continuous layers, and can be subsequently patterned into discrete patterned layer stacks for each memory cell 180.

Optionally, each memory cell 180 can include a dedicated steering device, such an access transistor (not shown) or a diode configured to activate a respective discrete patterned layer stack (220, 140, 348, 170) upon application of a suitable voltage to the steering device. The steering device may be electrically connected between the patterned layer stack and one of the first electrically conductive lines 30 or one of the second electrically conductive lines 90.

The first reference layer 132 has a fixed vertical magnetization that is perpendicular to an interface between the first reference layer 132 and the nonmagnetic tunnel barrier layer 134. The free layer 136 has perpendicular magnetic anisotropy to provide bistable magnetization states that include a parallel state having a magnetization that is parallel to the fixed vertical magnetization and an antiparallel state having a magnetization that is antiparallel to the fixed vertical magnetization.

The memory cell 180 can be programmed employing the voltage-controlled magnetic anisotropy (VCMA) effect. Thus, the memory cell 180 can be programmed employing an electrical voltage that is applied in one direction. In other words, a voltage is applied between a selected word line and a selected bit line, and the memory cell 180 can be toggled back and forth between the parallel and anti-parallel states by pulsing a voltage in one direction (e.g., in forward bias mode). In one embodiment, a very small current may flow between the free layer 136 and the first reference layer 132 during the writing step. However, the current is typically so small that spin-transfer torque (STT) effects can be ignored, and Ohmic dissipation should be minimal which reduces the write power. Optionally, an in-plane ancillary magnetic field may be provided by an external field source 60 configured to apply an in-plane ancillary magnetic field to the free layer 136.

A control circuit 401 provides a unipolar voltage between the first electrode 32 and the second electrode 92. The control circuit 401 may include one or more of, or all of, the various elements 560, 570, 580 and/or 590 shown in FIG. 1. The control circuit 401 can have two nodes that are connected to a respective one of the first electrode 32 and the second electrode 92 via a respective first electrically conductive line 30 and a respective second electrically conductive line 90.

Generally, the control circuit 401 can be configured to perform a programming operation by applying a programming pulse to a selected VCMA magnetoelectric memory cell 180 within the VCMA magnetoelectric memory device. The programming pulse has a same polarity (i.e., the first polarity) for a first magnetization state (i.e., a parallel alignment state) in which a free layer 136 and a first reference layer 132 in the selected VCMA magnetoelectric memory cell have parallel magnetization directions, and for a second magnetization state (i.e., an antiparallel alignment state) in which the free layer 136 and the first reference layer 132 in the selected VCMA magnetoelectric memory cell have antiparallel magnetization directions. The control circuit 401 can be configured to select a target VCMA magnetoelectric memory cell to be programmed within the VCMA magnetoelectric memory device, to determine an alignment state of magnetization of a free layer 136 (e.g., by reading the memory cell) and to apply a programming pulse if the alignment state of the target VCMA magnetoelectric memory cell is opposite to a target alignment configuration for the target VCMA magnetoelectric memory cell (thus, necessitating flipping of the magnetization of the free layer 136), and not to apply any programming pulse if the alignment state of the target VCMA magnetoelectric memory cell is in the target alignment configuration for the target VCMA magnetoelectric memory cell.

The programming pulse generates an electric field in the VCMA capping dielectric layer 348 and induces precession of a magnetization of a free layer 136 around an axis determined by magnetostatic interactions of various magnetic layers and the external magnetic field. In one embodiment, the programming pulse can be terminated when the polar angle is within a range from 0 radian to $\pi/20$ or when the polar angle is within a range from $19\pi/20$ to $\pi$.

In one embodiment, an optional external field source 60 can be provided, which is configured to apply an in-plane ancillary magnetic field to the free layer 136. The in-plane ancillary magnetic field induces gyration of an azimuthal magnetization direction of the free layer 136 upon application of an electric field between the first electrode 32 and the second electrode 92.

In one embodiment, the control circuit 401 may be configured to perform a sensing operation that determines a magnetization state of the free layer 136 by applying a sense voltage across the second electrode 92 and the first electrode 32 and by measuring magnetoresistance of the magnetic tunnel junction 140; to perform a comparison operation that determines whether the magnetization state of the free layer 136 is at a target magnetization state selected from an upward-pointing magnetization state and a downward-pointing magnetization state; and to apply a programming pulse across the second electrode 92 and the first electrode 32 only if the magnetization state of the free layer 136 is not the target magnetization state, and not to apply the programming pulse if the magnetization state of the free layer 136 is the target magnetization state.

In one embodiment, the programming pulse has a same polarity for programming the upward-pointing magnetization state into the downward-pointing magnetization state and for programming the downward-pointing magnetization state into the upward-pointing magnetization state.

In one embodiment, the sense voltage has a first polarity and generates a first electric field within the free layer 136 along a direction that increases magnetic anisotropy of the free layer 136; and the programming pulse has a second polarity that is an opposite of the first polarity and generates a second electric field within the free layer 136 along a direction that decreases magnetic anisotropy of the free layer 136. In one embodiment, the polarity of the sensing voltage is selected such that the applied electric field during the sensing operation increases the magnetic anisotropy of the free layer 136 through the VCMA effect (and thus, flipping of the magnetization of the free layer 136 becomes more difficult due to the applied field), and the polarity of the programming voltage is selected such that applied electric field during the programming operation decreases the magnetic anisotropy of the free layer 136 through the VCMA effect (and thus, flipping of the magnetization of the free layer 136 becomes easier due to the applied field).

Figure 3:
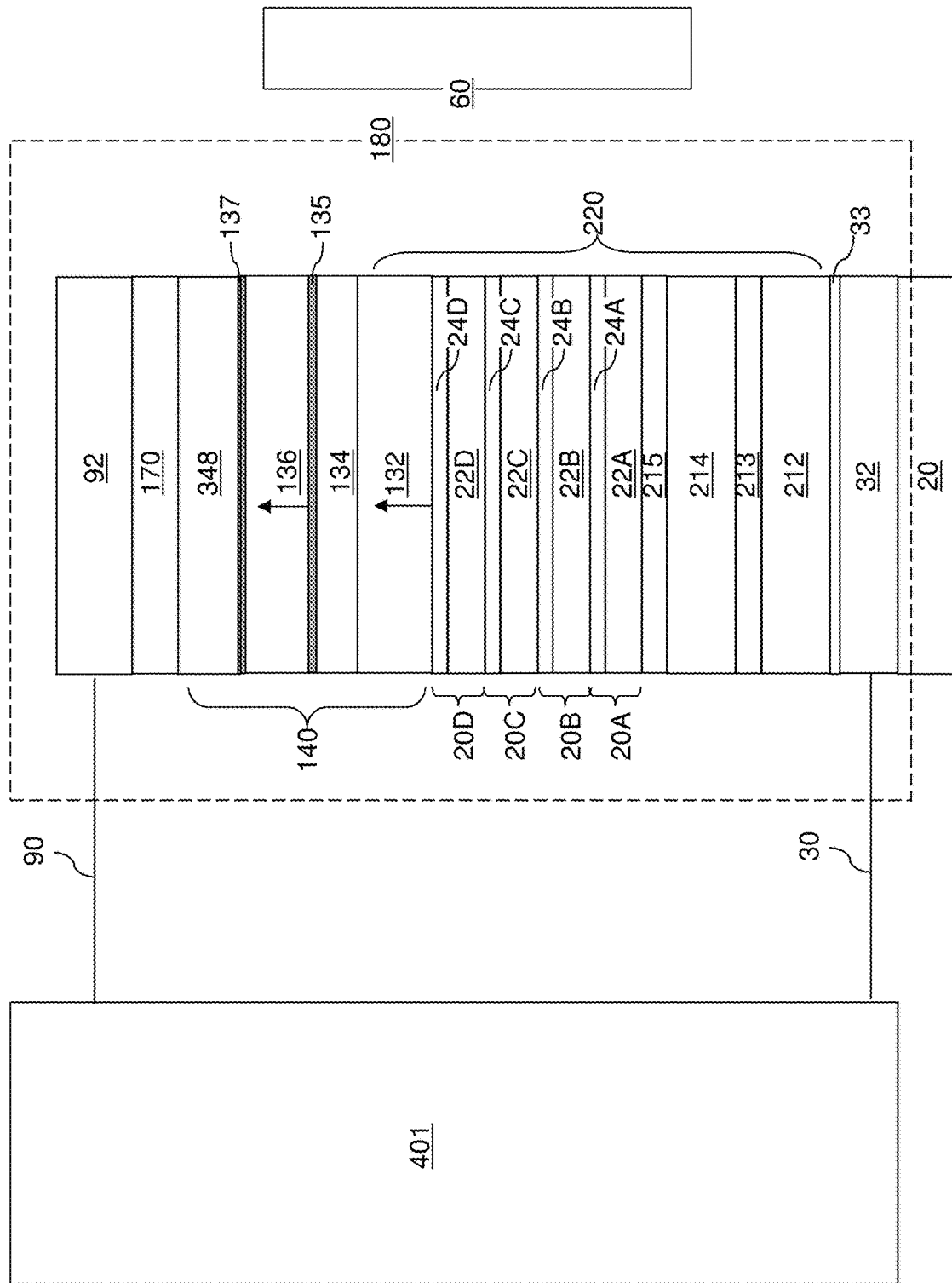
FIG. 3 illustrates a second configuration of the first exemplary VCMA memory device according to the first embodiment of the present disclosure.

Referring to FIG. 3, a second configuration of the first exemplary VCMA memory device can be derived from the first configuration of the first exemplary VCMA memory device by modifying the first composite reference magnetization structure 220. The first composite reference magnetization structure 220 is located between the first electrode 32 and the nonmagnetic tunnel barrier layer 134. The first composite reference magnetization structure 220 can include, along a direction from the first electrode 32 toward the second electrode 92, a fixed vertical magnetization structure (212, 213, 214) configured to generate a fixed vertical magnetic field at a planar end surface, a first nonmagnetic spacer metal layer 215, and the first reference layer 132. At least one first layer stack (20A, 20B, 20C, 20D) may be located between the first nonmagnetic spacer metal layer 215 and the first reference layer 132. The at least one first layer stack (20A, 20B, 20C, 20D) comprises a respective additional reference layer (22A, 22B, 22C, 22D) including a respective ferromagnetic material having perpendicular magnetic anisotropy, and a respective spacer dielectric metal oxide layer, such as a spacer dielectric metal oxide layer (24A, 24B, 24C, 24D).

In one embodiment, each of at least one the additional reference layer (22A, 22B, 22C, 22D) comprises, and/or consists essentially of, a material selected from CoFe and/or CoFeB. In one embodiment, each of the at least one additional reference layer (22A, 22B, 22C, 22D) comprises, and/or consists essentially of, CoFeB. In another embodiment, the additional reference layers (22A, 22B, 22C, 22D) comprise a first subset of the additional reference layers (e.g., 22A, 22B) that are located proximal to the fixed vertical magnetization structure (212, 213, 214) (including a bottommost additional reference layer 22A) and that comprise, and/or can consist essentially of, CoFe, and a second subset of the additional reference layer (e.g., 22C, 22D) that are located proximal to the magnetic tunnel junction 140 (including a topmost additional reference layer 22D) and that comprise, and/or can consist essentially of, CoFeB. Each of at least one the additional reference layers (22A, 22B, 22C, 22D) can be deposited, for example, by physical vapor deposition. Each of the at least one additional reference layer (22A, 22B, 22C, 22D) can be have a thickness in a range from 0.2 nm to 0.6 nm, such as from 0.3 nm to 0.5 nm, although lesser and greater thicknesses may also be employed.

The spacer dielectric metal oxide layer (24A, 24B, 24C, 24D) comprises, and/or consists essentially of, a material selected from magnesium oxide, hafnium oxide, tantalum oxide, or aluminum oxide. In one embodiment, the at least one spacer dielectric metal oxide layer (24A, 24B, 24C, 24D) comprises, and/or consists essentially of, magnesium oxide.

In another embodiment, the spacer dielectric metal oxide layers (24A, 24B, 24C, 24D) comprise a first subset of spacer dielectric metal oxide layers (e.g., 24A, 24B) that are located proximal to the fixed vertical magnetization structure (212, 213, 214) (including a bottommost spacer dielectric metal oxide layer 24A) and that comprise, and/or can consist essentially of, a dielectric metal oxide other than magnesium oxide, such as hafnium oxide, tantalum oxide, or aluminum oxide, and a second subset of the dielectric metal oxide layers (e.g., 24C, 24D) that are located proximal to the magnetic tunnel junction 140 (including a topmost dielectric metal oxide layer 24D) and that comprise, and/or can consist essentially of, magnesium oxide.

Each of the spacer dielectric metal oxide layers (24A, 24B, 24C, 24D) may be formed by a respective physical vapor deposition process, an atomic layer deposition process, or a chemical vapor deposition process. In one embodiment, each of the spacer dielectric metal oxide layers (24A, 24B, 24C, 24D) may have a smaller thickness than the nonmagnetic tunnel barrier layer 134. For example, each of the spacer dielectric metal oxide layers (24A, 24B, 24C, 24D) may have a thickness in a range from 0.2 nm to 0.8 nm and/or from 0.3 nm to 0.6 nm. The thickness of each of the spacer dielectric metal oxide layer (24A, 24B, 24C, 24D) may be in less than, equal to, or greater than the thickness of a monolayer of the material of the respective spacer dielectric metal oxide layer (24A, 24B, 24C, 24D).

In one embodiment, a topmost one of the at least one spacer dielectric metal oxide layers (24A, 24B, 24C, 24D) may be in contact with the reference layer 132. In an alternative embodiment, an additional nonmagnetic spacer metal layer may be located between the topmost one of the at least one spacer dielectric metal oxide layers (24A, 24B, 24C, 24D) and the reference layer 132. The additional nonmagnetic spacer metal layer can comprise, and/or consist essentially of, at least one metal selected from W, Mo or Ta. The thickness of the additional nonmagnetic spacer metal layer may be in a range from 0.2 nm to 0.8 nm, such as from 0.4 nm to 0.6 nm, although lesser and greater thicknesses may also be employed.

In one embodiment, at least one of the at least one spacer dielectric metal oxide layers (24A, 24B, 24C, 24D) comprises a respective first ferromagnetic-dielectric interface at a first planar surface that contacts one additional reference layers (22A, 22B, 22C, 22D), and a respective second ferromagnetic-dielectric interface at a second planar surface that contacts the reference layer 132 or another additional reference layer (22A, 22B, 22C, 22D). A third ferromagnetic-dielectric interface is located between the reference layer 132 and the nonmagnetic tunnel barrier layer 134. Thus, at least three ferromagnetic-dielectric interfaces are located between the nonmagnetic tunnel barrier layer 134 and the composite SAF structure (212, 213, 214) in the first composite reference magnetization structure 220.

The magnetic tunnel junction 140 can be located between the at least one first layer stack (20A, 20B, 20C, 20D) and the second electrode 92. Generally, the magnetic tunnel junction 140 comprises the reference layer 132, the free layer 136, and the nonmagnetic tunnel barrier layer 134 located between the reference layer 132 and the free layer 136. The reference layer 132 can be more proximal to the at least one first layer stack (20A, 20B, 20C, 20D) than the free layer 136 is to the at least one first layer stack (20A, 20B, 20C, 20D). In one embodiment, the nonmagnetic tunnel barrier layer 134 comprises, and/or consists essentially of, a material selected from magnesium oxide and a spinel material.

Figure 4:
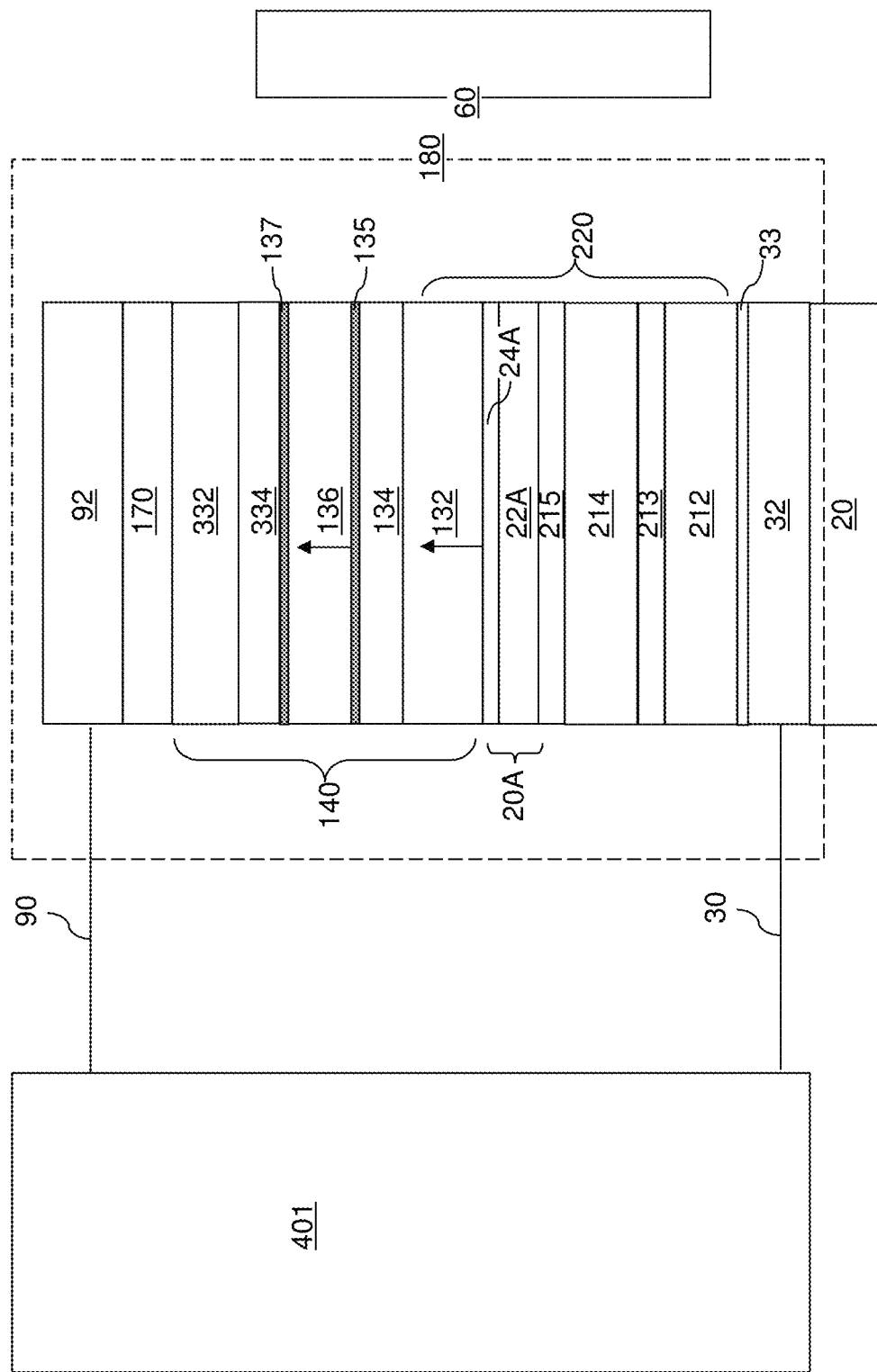
FIG. 4 illustrates a third configuration of the first exemplary VCMA memory device according to the first embodiment of the present disclosure.

Referring to FIG. 4, a third configuration of the first exemplary VCMA memory device may be derived from the first configuration or the second configuration of the first exemplary VCMA memory device illustrated in FIG. 2 by inserting a second reference layer 332 between the dielectric capping layer 334 and the nonmagnetic metallic capping layer 170. The second reference layer 332 can be in contact with the dielectric capping layer 334, and can have the same magnetization direction as the first reference layer 132. In one embodiment, the second reference layer 332 can include any ferromagnetic material that may be employed for the first reference layer 132, and can have a thickness within the thickness range for the first reference layer 132. The second reference layer 332, if present, reinforces the reference magnetic field generated by the first reference layer 132.

Figure 5:
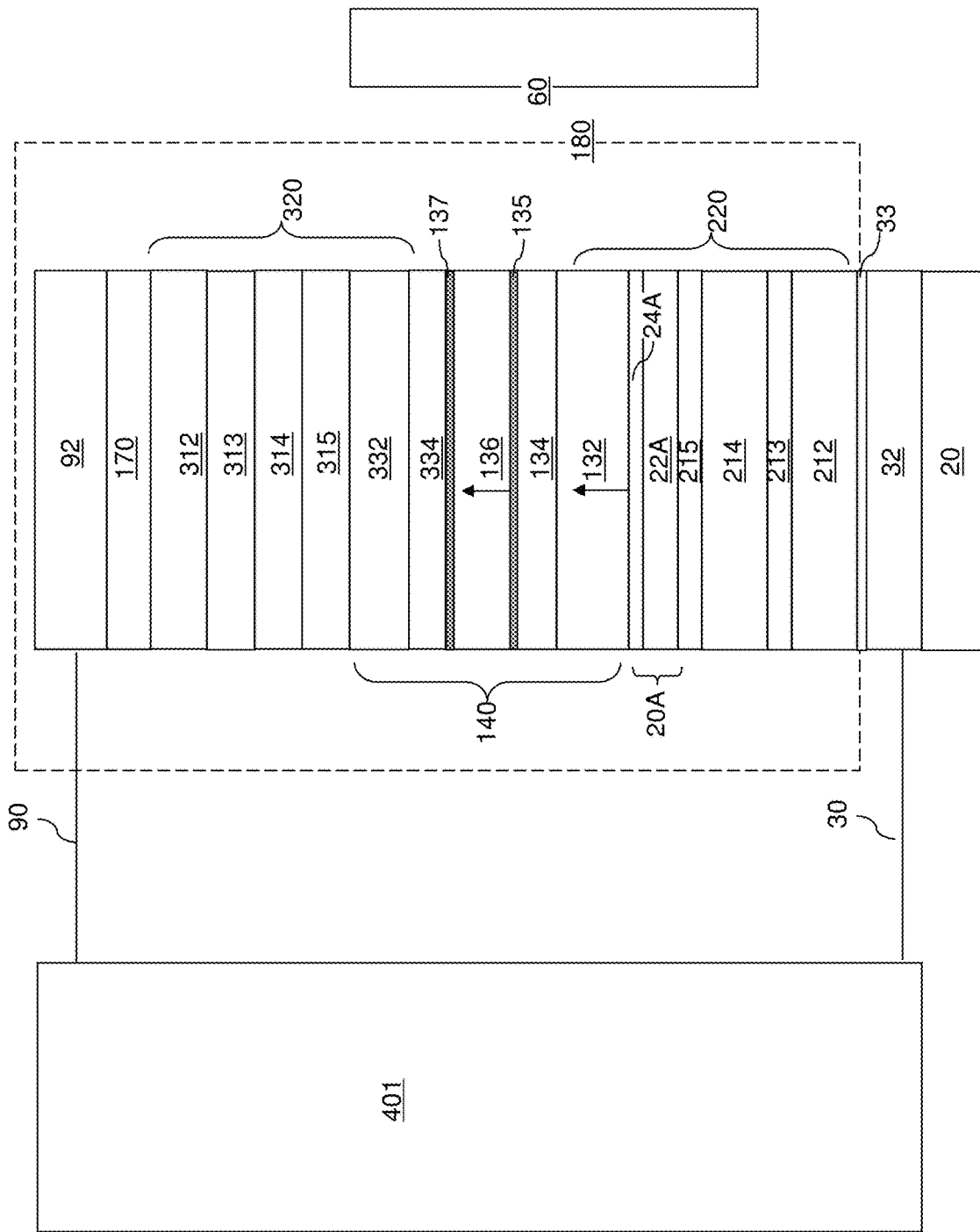
FIG. 5 illustrates a fourth configuration of the first exemplary VCMA memory device according to the first embodiment of the present disclosure.

Referring to FIG. 5, a fourth configuration of the first exemplary VCMA memory device may be derived from the third configuration of the first exemplary VCMA memory device by providing a second composite reference magnetization structure 320 between the dielectric capping layer 334 and the second electrode 92. The second composite reference magnetization structure 320 includes, along a direction from the dielectric capping layer 334 toward the second electrode 92, the second reference layer 332, a second nonmagnetic spacer metal layer 315, and a fixed vertical magnetization structure (314, 313, 312) configured to generate a fixed vertical magnetic field at an interface with the second nonmagnetic spacer metal layer 315. In other words, the second composite reference magnetization structure 320 can include, along a direction from the second electrode 92 toward the free layer 136, a fixed vertical magnetization structure (312, 313, 314) configured to generate a fixed vertical magnetic field at a planar end surface and a second nonmagnetic spacer metal layer 315.

In one embodiment, the fixed vertical magnetization structure (312, 313, 314) may comprise a composite synthetic antiferromagnet (SAF) structure including a first superlattice 312, a second superlattice 314, and an antiferromagnetic coupling layer 313 having a thickness that provides antiferromagnetic coupling between the first superlattice 312 and the second superlattice 314. In one embodiment, the first superlattice comprises a first superlattice of first cobalt layers and first platinum layers, and the second superlattice 314 comprises a second superlattice of second cobalt layers and second platinum layers. In one embodiment, the first superlattice 312 comprises N1 repetitions of a first unit layer stack of a first cobalt layer and a first platinum layer, and a first capping cobalt layer such that N1 first platinum layers are interlaced with (N1+1) first cobalt layers. The integer N1 may be in a range from 2 to 10, such as from 3 to 6, although lesser and greater numbers may also be employed for N1. In one embodiment, the second superlattice 314 comprises N2 repetitions of a second unit layer stack of a second cobalt layer and a second platinum layer, and a second capping cobalt layer such that N2 first platinum layers are interlaced with (N2+1) second cobalt layers. The integer N2 may be in a range from 2 to 10, such as from 3 to 6, although lesser and greater numbers may also be employed for N2. In an illustrative example, the first cobalt layers and the second cobalt layers may have a respective thickness of 0.2 nm to 0.5 nm, and the first platinum layers and the second platinum layers may have a respective thickness of about 0.1 nm to 0.3 nm. It is understood that a material layer having a thickness that is less than the thickness of a monolayer refers to a discontinuous layer having a fractional coverage that is equal to the ratio of the thickness of the material layer to the thickness of the monolayer.

The antiferromagnetic coupling layer 313 comprises a material composition and a thickness that provide antiferromagnetic coupling between the first permanent ferromagnetic layer 312 and the second permanent ferromagnetic layer 314. In one embodiment, the antiferromagnetic coupling layer 313 can include ruthenium or iridium, and can have a thickness in a range from 0.3 nm to 0.8 nm.

The second nonmagnetic spacer metal layer 315 can be located on a planar bottom surface of the fixed vertical magnetization structure (312, 313, 314). The second nonmagnetic spacer metal layer 315 can comprise, and/or consist essentially of, at least one refractory metal having a melting point higher than 2,000 degrees Celsius. For example, the second nonmagnetic spacer metal layer 315 can comprise, and/or consist essentially of, at least one metal selected from W, Mo or Ta. The thickness of the second nonmagnetic spacer metal layer 315 may be in a range from 0.1 nm to 0.3 nm, such as from 0.15 nm to 0.25 nm, although lesser and greater thicknesses may also be employed. The second nonmagnetic spacer metal layer 315 may be deposited, for example, by physical vapor deposition. In one embodiment, the second nonmagnetic spacer metal layer 315 may consist essentially of tungsten.

Figure 6A:
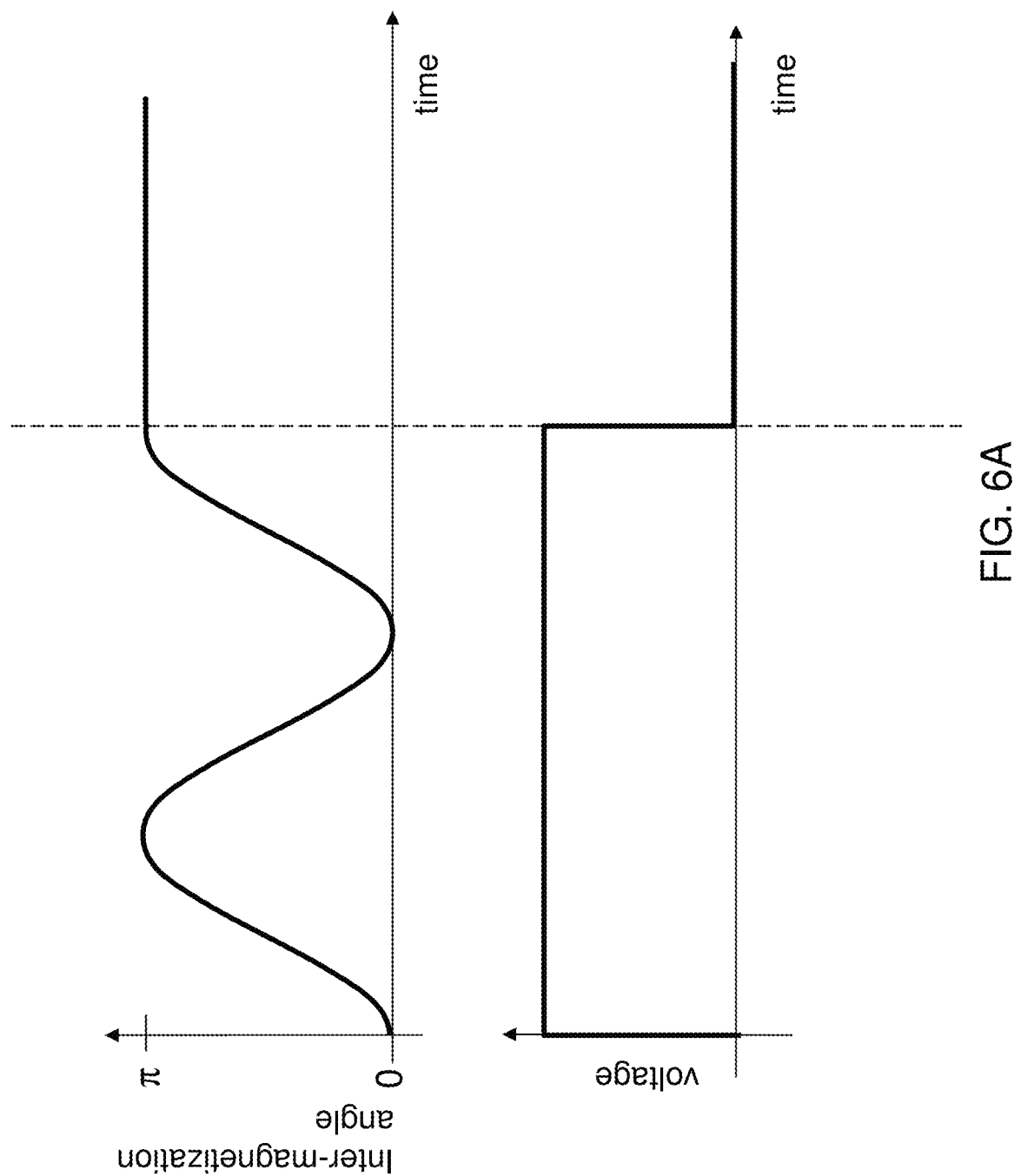
FIG. 6A illustrates a first exemplary programming pulse pattern for switching a magnetization state of a free layer from a parallel state to an antiparallel state according to an embodiment of the present disclosure.

Referring to FIG. 6A, an example of a programming step is illustrated, in which a selected VCMA magnetoelectric memory cell 180 in a parallel alignment state is programmed into an antiparallel alignment state by a programming pulse of the first polarity that terminates when the polar angle between the magnetization direction of the free layer 136 with respect to the fixed magnetization direction of the first reference layer 132 is within a range from $19\pi/20$ to $\pi$. The duration of the programming pulse may be in range from 0.02 ns to 0.5 ns, although lesser and greater duration of the programming pulse can also be employed.

Figure 6B:
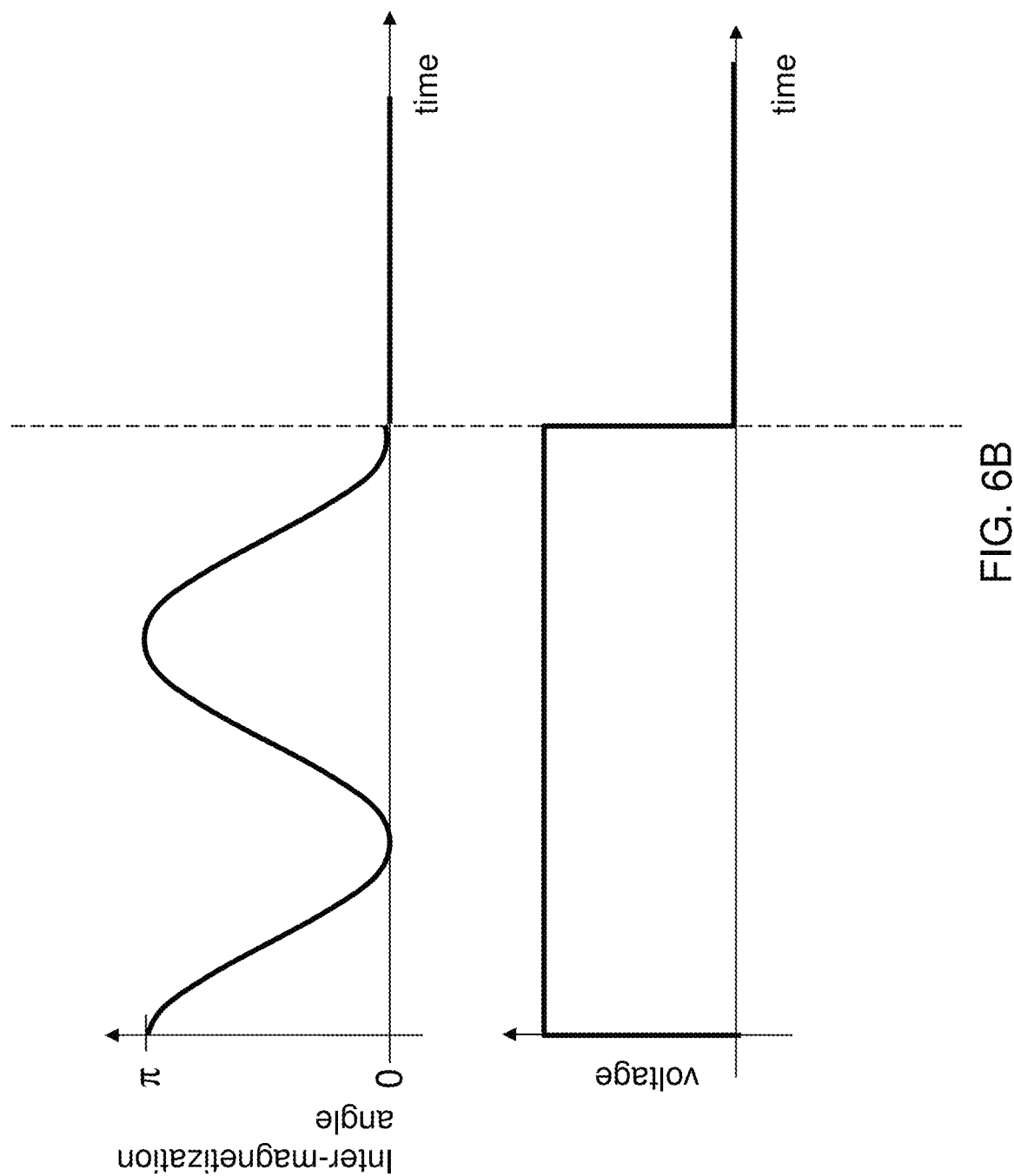
FIG. 6B illustrates a second exemplary programming pulse pattern for switching a magnetization state of a free layer from an antiparallel state to a parallel state according to an embodiment of the present disclosure.

Referring to FIG. 6B, an example of a programming step is illustrated, in which a selected VCMA magnetoelectric memory cell in an antiparallel alignment state is programmed into a parallel alignment state by a programming pulse of the first polarity that terminates when the polar angle between the magnetization direction of the free layer 136 with respect to the fixed magnetization direction of the first reference layer 132 is within a range from 0 to $\pi/20$.

Thus, the control circuit 401 is configured to perform a programming operation by applying a programming voltage between the first electrode 32 and the second electrode 92, wherein the programming voltage has a same polarity for a first magnetization state in which the free layer 136 and the first reference layer 132 have parallel magnetization directions and for a second magnetization state in which the free layer and the reference layer have antiparallel magnetization directions. The magnitude of the programming voltage may be in a range from 500 mV to 3 V. The control circuit 401 is also configured to perform a sensing (i.e., reading) operation by applying a voltage between 100 mV and 1.5 V between the first and second electrodes.

A method of operating the memory cell 180 of the first embodiment comprises applying a first programming voltage of a first polarity between the first electrode 32 and the second electrode 92 to switch a first magnetization state of the free layer 136 in which the free layer and the first reference layer 132 have parallel magnetization directions to a second magnetization state of the free layer in which the free layer and the reference layer have antiparallel magnetization directions. The method further comprises applying a second programming voltage of the first polarity between the first electrode and the second electrode to switch the second magnetization state of the free layer to the first magnetization state of the free layer. The first programming voltage and the second programming voltage generate an electric field in the dielectric capping layer which induces precession in the free layer 136. As shown in FIGS. 6A and 6B, the method includes terminating the first programming voltage when the free layer has the first magnetization direction, and terminating the second programming voltage when the free layer has the second magnetization direction. In one embodiment, an external magnetic field is optionally applied by the external field source 60 during the step of applying the first programming voltage.

The magnetoelectric memory device illustrated in FIGS. 2-5 can be manufactured by forming a layer stack including, from one side to another, a first electrode 32, a first reference layer 132, a nonmagnetic tunnel barrier layer 134, a first nonmagnetic metal dust layer 135, a free layer 136, a second nonmagnetic metal dust layer 137, a dielectric capping layer 348, and a second electrode 92 in a forward order or in a reverse order. A first composite reference magnetization structure 220 and/or a second composite reference magnetization structure 320 may, or may not, be employed. A control circuit 401 can be formed, and the first electrode 32 and the second electrode 92 can be connected to a respective node of the control circuit 401. The first reference layer 132 has a fixed magnetization direction, and the free layer 136 has magnetic anisotropy that provides magnetization directions that are parallel or antiparallel to the fixed magnetization direction.

Figure 7A:
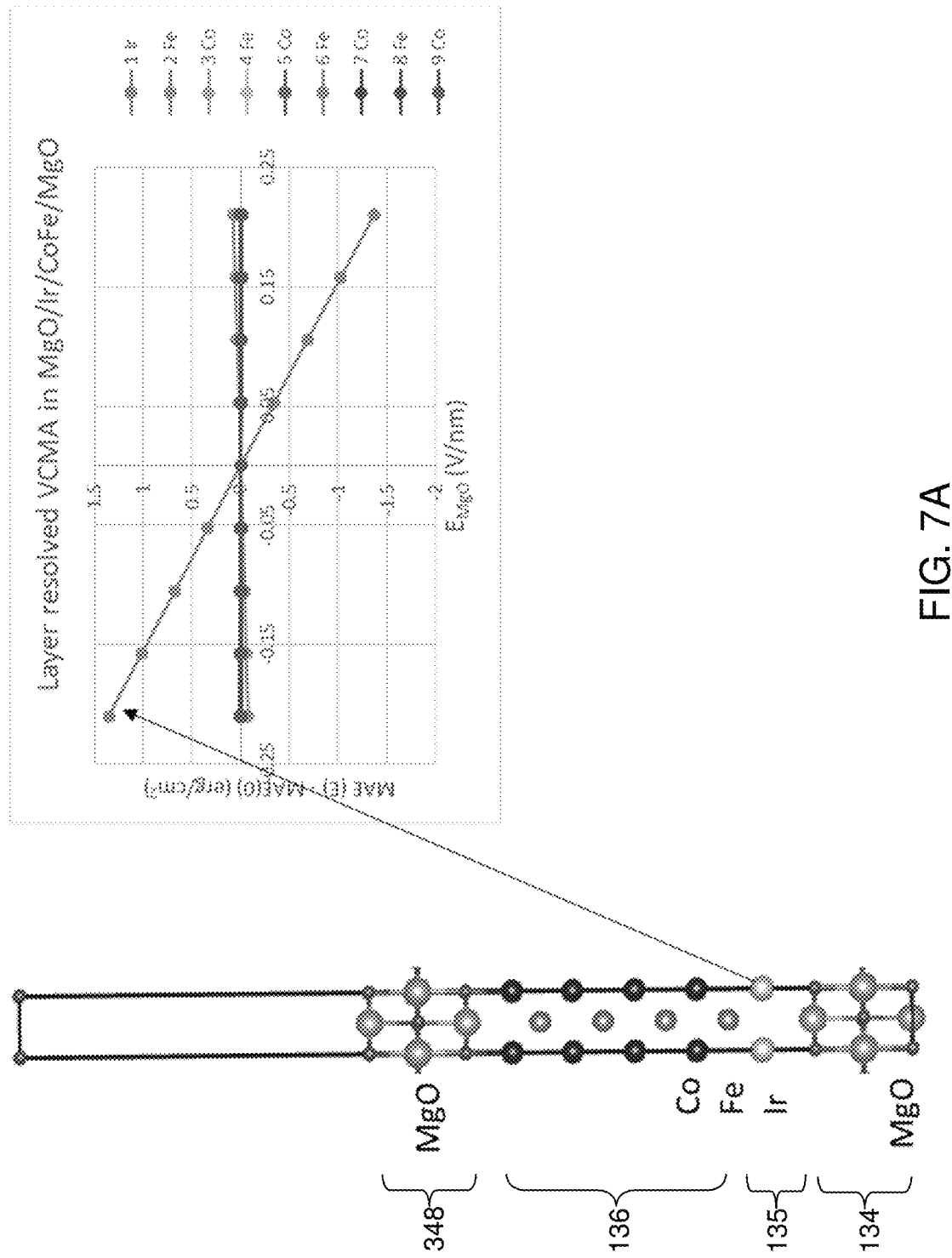
FIG. 7A is an atomic-level model and a graph for the magnetic anisotropy energy as a function of an applied electric field for a first comparative magnetic tunnel junction in a comparative exemplary VCMA device.

Referring to FIG. 7A, an atomic-level model for a magnetic tunnel junction and a graph for the magnetic anisotropy energy density as a function of an applied electric field in units of volts per nanometer at the dielectric capping layer 348 are illustrated for a first comparative magnetic tunnel junction in a comparative exemplary VCMA device. The first comparative magnetic tunnel junction includes an iridium monolayer as the first nonmagnetic metal dust layer 135, CoFe free layer 136, MgO tunneling barrier layer 134 and MgO dielectric capping layer 348. The second nonmagnetic metal dust layer 137 is omitted in order to quantify the effect of the presence of the first nonmagnetic metal dust layer 135 while the second nonmagnetic metal dust layer 137 is absent. Simulations were performed to determine the effect of the presence of the iridium layer as the first nonmagnetic metal dust layer 135 on the magnetic anisotropy energy of the structure, and a VCMA coefficient due to the presence of an iridium layer as the first nonmagnetic metal dust layer 135 was calculated. The value of the overall VCMA coefficient in this configuration was estimated to be about −3,650 fJ/V·m based on ab initio calculations at zero degrees Kelvin. Thus, the iridium dust layer 135 provides a large negative VCMA contribution. The layer resolved VCMA in FIG. 7A shows that a predominant contribution to overall VCMA comes from the iridium atoms.

Figure 7B:
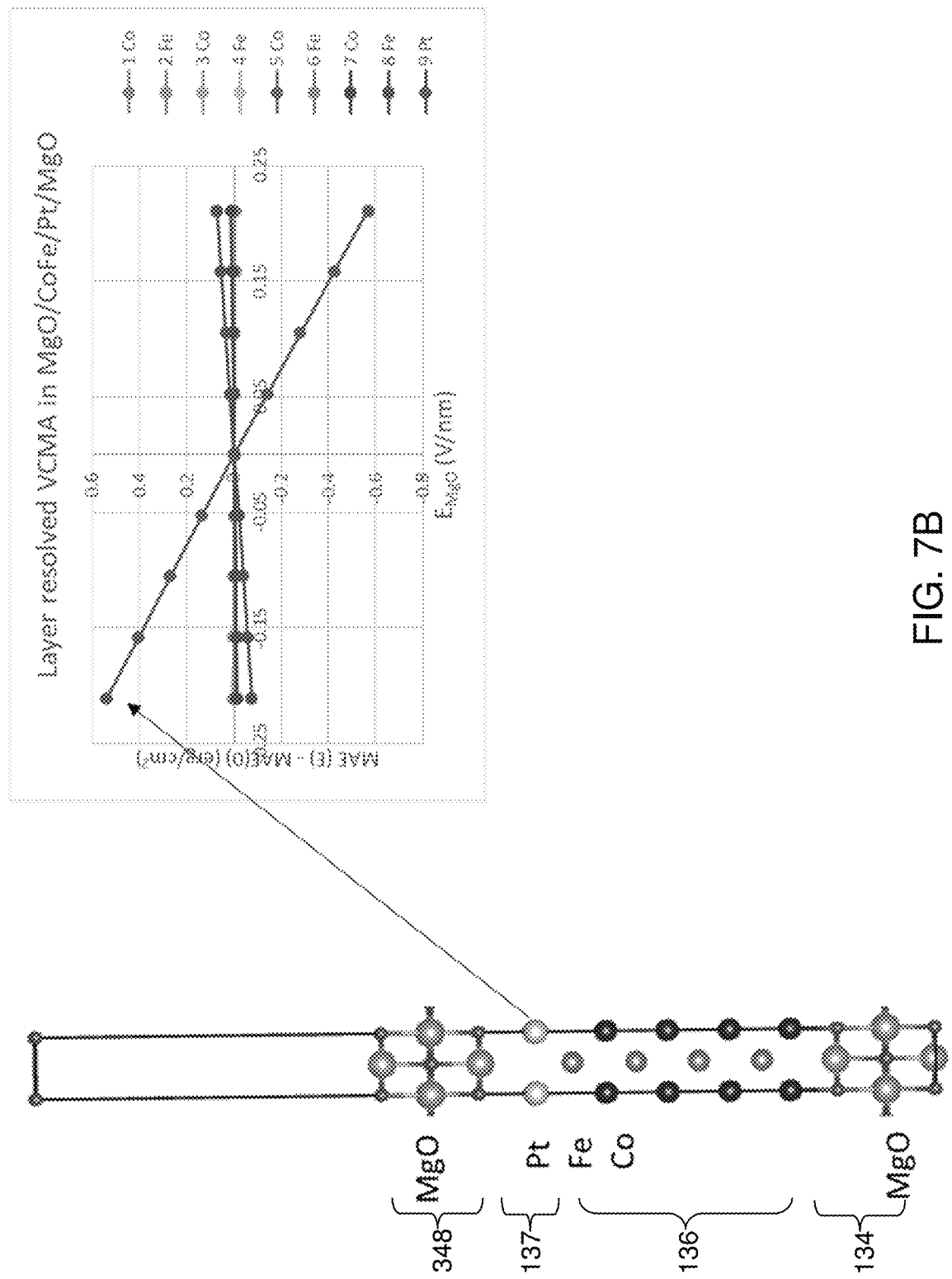
FIG. 7B is an atomic-level model and a graph for the magnetic anisotropy energy as a function of an applied electric field for a second comparative magnetic tunnel junction for a comparative exemplary VCMA device.

Referring to FIG. 7B, an atomic-level model for a magnetic tunnel junction and a graph for the magnetic anisotropy energy density as a function of an applied electric field are illustrated for a second comparative magnetic tunnel junction in a comparative exemplary VCMA device. The second comparative magnetic tunnel junction includes a platinum monolayer as the second nonmagnetic metal dust layer 137, CoFe free layer 136, MgO tunneling barrier layer 134 and MgO dielectric capping layer 348. The first nonmagnetic metal dust layer 135 is omitted in order to quantify the effect of the presence of the second nonmagnetic metal dust layer 137 while the first nonmagnetic metal dust layer 135 is absent. Simulations were performed to determine the effect of the presence of the platinum layer as the second nonmagnetic metal dust layer 137 on the magnetic anisotropy energy of the structure, and a VCMA coefficient due to the presence of a platinum layer as the second nonmagnetic metal dust layer 137 was calculated. The value of the overall VCMA coefficient in this configuration was estimated to be about −1,280 fJ/V·m at zero degrees Kelvin. Thus, if the second nonmagnetic metal dust layer 137 was instead located between the free layer 136 and the tunnel barrier layer 134, then the overall VCMA coefficient in this configuration would be positive 1,280 fJ/V·m at zero degrees Kelvin (i.e., where the platinum has an opposite sign of the VCMA coefficient compared to iridium located in the same located in the device). The layer resolved VCMA in FIG. 7B shows that a predominant contribution to overall VCMA comes from the platinum atoms.

Figure 7C:
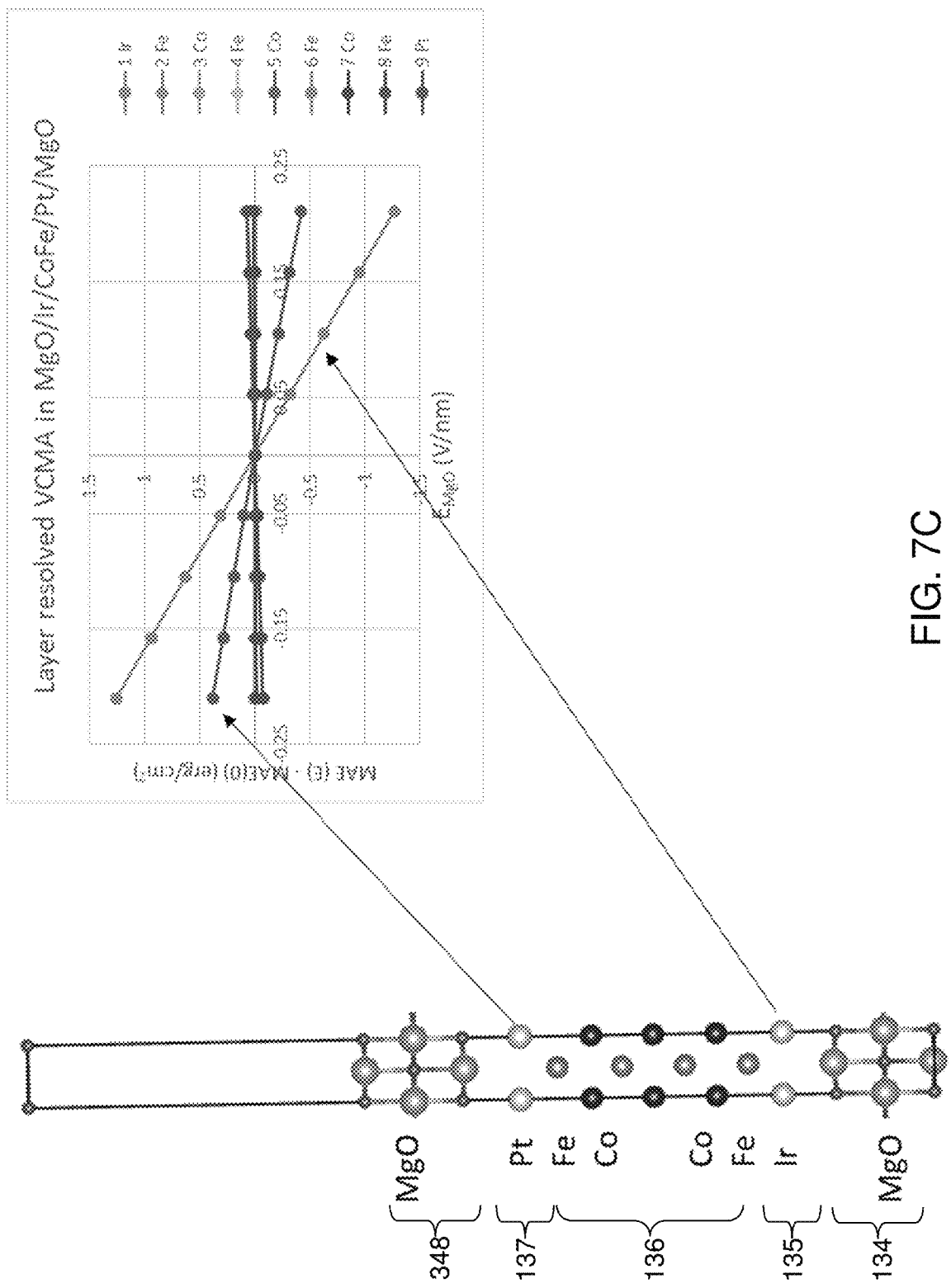
FIG. 7C is an atomic-level model and a graph for the magnetic anisotropy energy as a function of an applied electric field for the comparative magnetic tunnel junction for the first exemplary VCMA device.

Referring to FIG. 7C, an atomic-level model for a magnetic tunnel junction and a graph for the magnetic anisotropy energy density as a function of an applied electric field are illustrated for a magnetic tunnel junction in the first exemplary VCMA device of FIGS. 2-5. The magnetic tunnel junction includes an iridium monolayer as the first nonmagnetic metal dust layer 135, a platinum monolayer as the second nonmagnetic metal dust layer 137, CoFe free layer 136, MgO tunneling barrier layer 134 and MgO dielectric capping layer 348. Thus, both the first nonmagnetic metal dust layer 135 and the second nonmagnetic metal dust layer 137 are present. Simulations were performed to determine the effect of the presence of the iridium monolayer as the first nonmagnetic metal dust layer 135 and the presence of the platinum layer as the second nonmagnetic metal dust layer 137 on the magnetic anisotropy energy of the structure. The value of the overall VCMA coefficient in this configuration was estimated to be about −4550 fJ/Vm at zero degrees Kelvin. A higher total VCMA coefficient was obtained employing the configuration of the first exemplary VCMA memory device of FIG. 7C relative to the comparative exemplary devices of FIGS. 7A and 7B.

Generally, the first nonmagnetic metal dust layer 135 provides a first voltage-controlled magnetic anisotropy coefficient; the second nonmagnetic metal dust layer 137 provides a second voltage-controlled magnetic anisotropy coefficient; and a magnitude of the second voltage-controlled magnetic anisotropy coefficient is at least 25% of a magnitude of the first voltage-controlled magnetic anisotropy coefficient. In one embodiment, the first voltage-controlled magnetic anisotropy coefficient has an absolute magnitude greater than 2,400 fJ/V·m; and the second voltage-controlled magnetic anisotropy coefficient has an absolute magnitude greater than 800 fJ/V·m at zero degrees Kelvin. The combination of the first nonmagnetic metal dust layer 135 and the second nonmagnetic metal dust layer 137 can provide a total VCMA coefficient having an absolute magnitude above 3,000 fJ/Vm and/or above 4,000 fJ/V·m, such as 4,000 to 4,550 fJ/V·m at zero degrees Kelvin.

Figure 8:
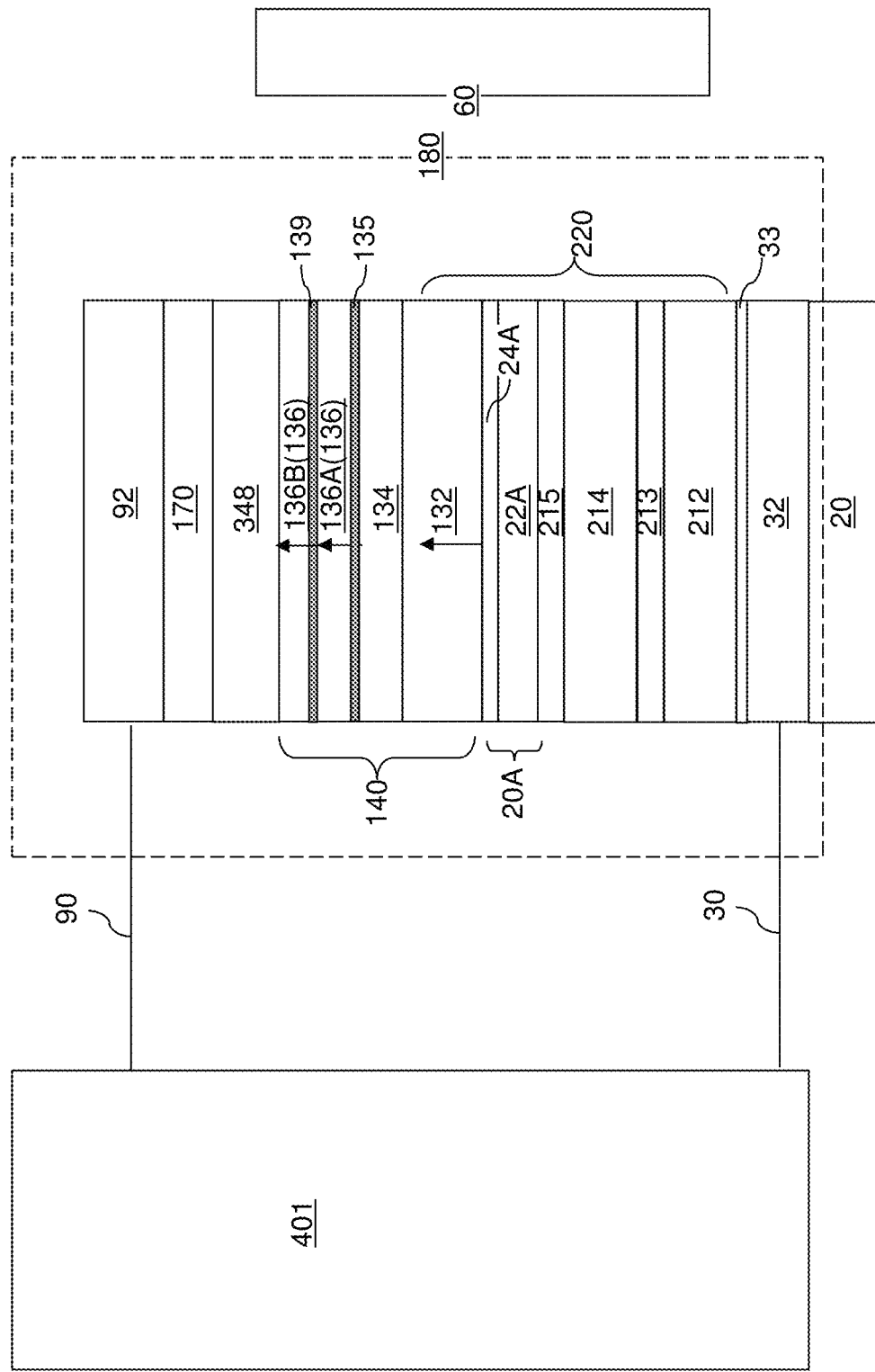
FIG. 8 illustrates a first configuration of a second exemplary VCMA memory device according to a second embodiment of the present disclosure.

Referring to FIG. 8, a first configuration of a second exemplary VCMA memory device according to a second embodiment of the present disclosure is illustrated, which can be derived from the first configuration of the first exemplary VCMA memory device of FIG. 2 by modifying the combination of the first nonmagnetic metal dust layer 135, the free layer 136, and the second nonmagnetic metal dust layer 137. Specifically, the combination of the first nonmagnetic metal dust layer 135, the free layer 136, and the second nonmagnetic metal dust layer 137 in the first exemplary VCMA memory device of FIG. 2 is replaced with a combination of a first nonmagnetic metal dust layer 135 and a free layer 136 including a first component free layer 136A and a second component free layer 136B that are spaced from each other by a second nonmagnetic metal dust layer 139. In other words, the second nonmagnetic metal dust layer 139 is embedded in the free layer 136. Further, the material composition and the thickness of each of the first nonmagnetic metal dust layer 135 and the second nonmagnetic metal dust layer 139 are selected such that the first nonmagnetic metal dust layer 135 and the second nonmagnetic metal dust layer 139 have the same polarity voltage-controlled magnetic anisotropy coefficients. It should be noted that the polarity of the VCMA coefficient contribution from the dust layer also depends on the distance between the dust layer and the free layer's interface. Each of the first component free layer 136A and the second component free layer 136B may have a respective material composition that may be any of the material compositions of the free layer 136.

In one embodiment, each of the first nonmagnetic metal dust layer 135 and the second nonmagnetic metal dust layer 139 consists essentially of respective at least one elemental metal. The at least one elemental metal can be selected from Ir, Mg, Pd, Pt, W, Ta, Hf, Ru, or Rh. Alternatively, the first nonmagnetic metal dust layer 135 and the second nonmagnetic metal dust layer 139 may comprise an alloy, such as a Mg—Al alloy. The first nonmagnetic metal dust layer 135 and the second nonmagnetic metal dust layer 139 may include the same metal or may include different metals. In one embodiment, each of the first nonmagnetic metal dust layer 135 and the second nonmagnetic metal dust layer 139 may consist essentially of a iridium.

Each of the first nonmagnetic metal dust layer 135 and the second nonmagnetic metal dust layer 139 may be formed by physical vapor deposition (i.e., sputtering). The thickness of each of the first nonmagnetic metal dust layer 135 and the second nonmagnetic metal dust layer 139 can be less than 5 monolayers of the at least one elemental metal. In one embodiment, the thickness of each of the first nonmagnetic metal dust layer 135 and the second nonmagnetic metal dust layer 139 can be in a range from 0.1 nm to 1.2 nm, such as from 0.1 nm to 0.8 nm, and/or from 0.2 nm to 0.5 nm. In one embodiment, one, or both, of the first nonmagnetic metal dust layer 135 and the second nonmagnetic metal dust layer 139 has a sub-monolayer thickness and includes openings therethrough. In one embodiment, one, or both, of the first nonmagnetic metal dust layer 135 and the second nonmagnetic metal dust layer 139 is discontinuous, i.e., includes multiple clusters that do not contact one another. The number of metal atoms in each cluster may be in a range from 1 to 100. In this case, the thickness of one, or both, of the first nonmagnetic metal dust layer 135 and the second nonmagnetic metal dust layer 139 may be in a range from 0.1 nm to 0.2 nm. Alternatively, one, or both, of the first nonmagnetic metal dust layer 135 and the second nonmagnetic metal dust layer 139 can have a thickness in a range from 1 monolayer of the at least one elemental metal and 5 monolayers of the at least one elemental metal.

In one embodiment, the first nonmagnetic metal dust layer 135 and the second nonmagnetic metal dust layer 139 consist essentially of the same single nonmagnetic metallic element. In one embodiment, the first nonmagnetic metal dust layer 135 comprises, and/or consists essentially of, a first iridium layer having a thickness in a range from 0.1 monolayer of iridium to 2 monolayers of iridium, such as a monolayer of iridium. In one embodiment, the second nonmagnetic metal dust layer 139 comprises, and/or consists essentially of, a second iridium layer having a thickness in a range from 0.1 monolayer of platinum to 2 monolayers of iridium, such as a monolayer of iridium.

In one embodiment, the second nonmagnetic metal dust layer 139 is more proximal to the dielectric capping layer 348 than to the first nonmagnetic metal dust layer 135. In one embodiment, each of the nonmagnetic tunnel barrier layer 134 and the dielectric capping layer 348 comprises, and/or consists essentially of, a respective material selected from magnesium oxide or magnesium aluminum oxide spinel material.

In one embodiment, the thickness to dielectric constant ratio of the dielectric capping layer 348 is greater than a thickness to dielectric constant ratio of the nonmagnetic tunnel barrier layer 134 such that a potential difference across the dielectric capping layer 348 is greater than a potential different across the nonmagnetic tunnel barrier layer 134 during application of a voltage across the second electrode 92 and the first electrode 32.

In one embodiment, the first nonmagnetic metal dust layer 135 provides a first voltage-controlled magnetic anisotropy coefficient to the free layer 136; the second nonmagnetic metal dust layer 139 provides a second voltage-controlled magnetic anisotropy coefficient to the free layer 136; and a magnitude of the second voltage-controlled magnetic anisotropy coefficient is at least 25% of a magnitude of the first voltage-controlled magnetic anisotropy coefficient. In one embodiment, the first voltage-controlled magnetic anisotropy coefficient has an absolute magnitude greater than 2,400 fJ/V·m; and the second voltage-controlled magnetic anisotropy coefficient has an absolute magnitude greater than 800 fJ/V·m at zero degrees Kelvin.

In one embodiment, at least one of the first nonmagnetic metal dust layer 135 and the second nonmagnetic metal dust layer 137 has a sub-monolayer thickness; and the at least one of the first nonmagnetic metal dust layer 135 and the second nonmagnetic metal dust layer 137 includes openings therethrough or includes multiple clusters that do not contact one another.

In one embodiment, an external field source 60 can be provided, which is configured to apply an in-plane ancillary magnetic field to the free layer 136. The in-plane ancillary magnetic field induces gyration of an azimuthal magnetization direction of the free layer 136 upon application of an electric field between the first electrode 32 and the second electrode 92.

The control circuit 401 may be the same as in the first exemplary VCMA memory device. In one embodiment, the control circuit 401 may be configured to perform a sensing operation that determines a magnetization state of the free layer 136 by applying a sense voltage across the second electrode 92 and the first electrode 32 and by measuring magnetoresistance of the magnetic tunnel junction 140; to perform a comparison operation that determines whether the magnetization state of the free layer 136 is at a target magnetization state selected from an upward-pointing magnetization state and a downward-pointing magnetization state; and to apply a programming pulse across the second electrode 92 and the first electrode 32 only if the magnetization state of the free layer 136 is not the target magnetization state, and not to apply the programming pulse if the magnetization state of the free layer 136 is the target magnetization state.

In one embodiment, the programming pulse has a same polarity for programming the upward-pointing magnetization state into the downward-pointing magnetization state and for programming the downward-pointing magnetization state into the upward-pointing magnetization state.

In one embodiment, the sense voltage has a first polarity and generates a first electric field within the free layer 136 along a direction that increases magnetic anisotropy of the free layer 136; and the programming pulse has a second polarity that is an opposite of the first polarity and generates a second electric field within the free layer 136 along a direction that decreases magnetic anisotropy of the free layer 136. In one embodiment, the polarity of the sensing voltage is selected such that the applied electric field during the sensing operation increases the magnetic anisotropy of the free layer 136 through the VCMA effect (and thus, flipping of the magnetization of the free layer 136 becomes more difficult due to the applied field), and the polarity of the programming voltage is selected such that applied electric field during the programming operation decreases the magnetic anisotropy of the free layer 136 through the VCMA effect (and thus, flipping of the magnetization of the free layer 136 becomes easier due to the applied field).

Figure 9:
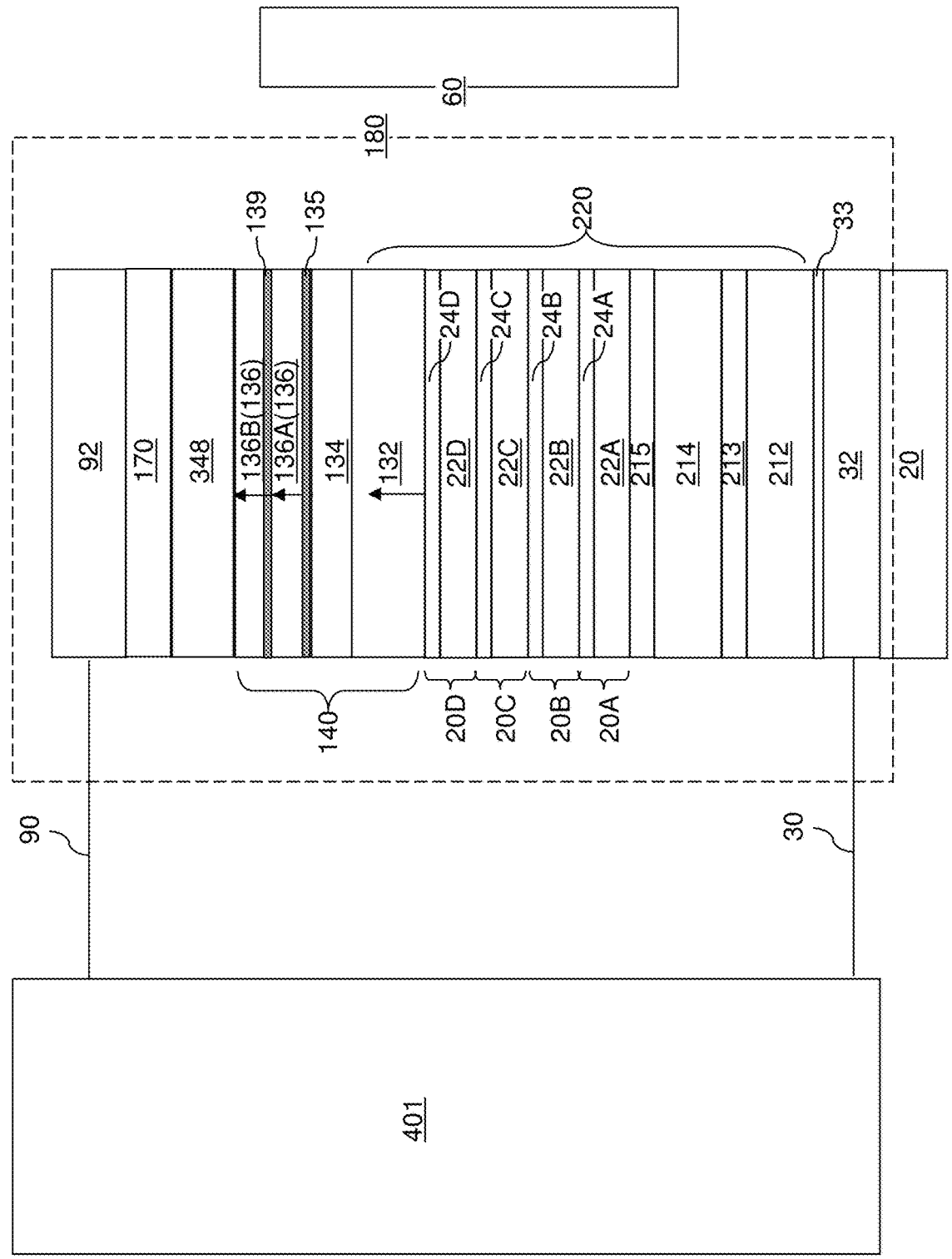
FIG. 9 illustrates a second configuration of the second exemplary VCMA memory device according to the second embodiment of the present disclosure.

Referring to FIG. 9, a second configuration of the second exemplary VCMA memory device can be derived from the first configuration of the second exemplary VCMA memory device of FIG. 8 by modifying the first composite reference magnetization structure 220. The first composite reference magnetization structure 220 is located between the second electrode 32 and the nonmagnetic tunnel barrier layer 134. The first composite reference magnetization structure 220 can include, along a direction from the second electrode 32 toward the second electrode 92, a fixed vertical magnetization structure (212, 213, 214) configured to generate a fixed vertical magnetic field at a planar end surface, a first nonmagnetic spacer metal layer 215, and the first reference layer 132. At least one first layer stack (20A, 20B, 20C, 20D) may be located between the first nonmagnetic spacer metal layer 215 and the first reference layer 132. The at least one first layer stack (20A, 20B, 20C, 20D) comprises a respective additional reference layer (22A, 22B, 22C, 22D) including a respective ferromagnetic material having perpendicular magnetic anisotropy, and a respective spacer dielectric metal oxide layer, such as a spacer dielectric metal oxide layer (24A, 24B, 24C, 24D). Generally, the first composite reference magnetization structure 220 may have the same as in the first exemplary VCMA memory device.

Figure 10:
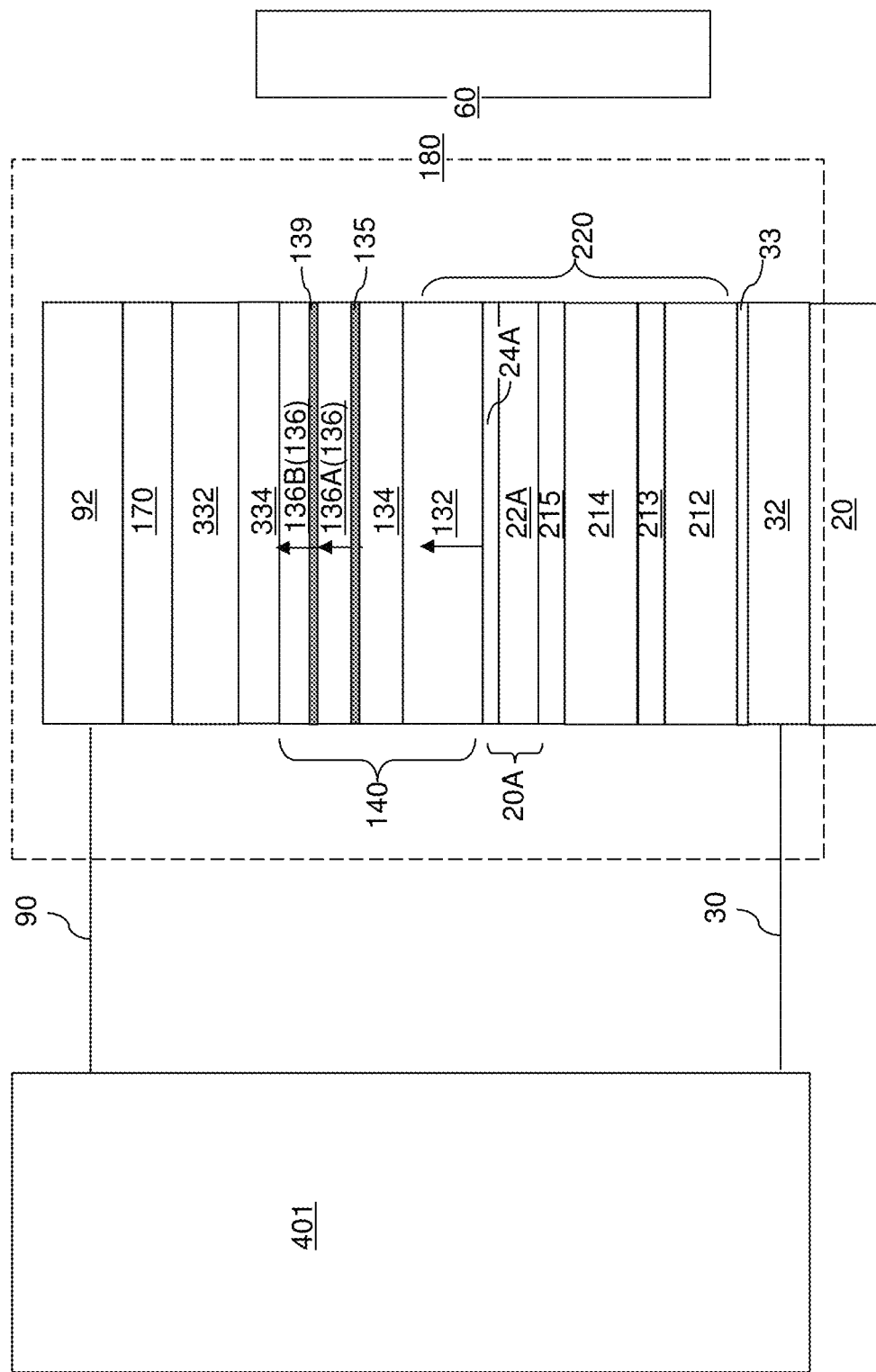
FIG. 10 illustrates a third configuration of the second exemplary VCMA memory device according to the second embodiment of the present disclosure.

Referring to FIG. 10, a third configuration of the second exemplary VCMA memory device may be derived from the first configuration or the second configuration of the second exemplary VCMA memory device illustrated in FIG. 8 by inserting a second reference layer 332 between the dielectric capping layer 334 and the nonmagnetic metallic capping layer 170. The second reference layer 332 can be in contact with the dielectric capping layer 334, and can have the same magnetization direction as the first reference layer 132. In one embodiment, the second reference layer 332 can include any ferromagnetic material that may be employed for the first reference layer 132, and can have a thickness within the thickness range for the first reference layer 132. The second reference layer 332, if present, reinforces the reference magnetic field generated by the first reference layer 132.

Figure 11:
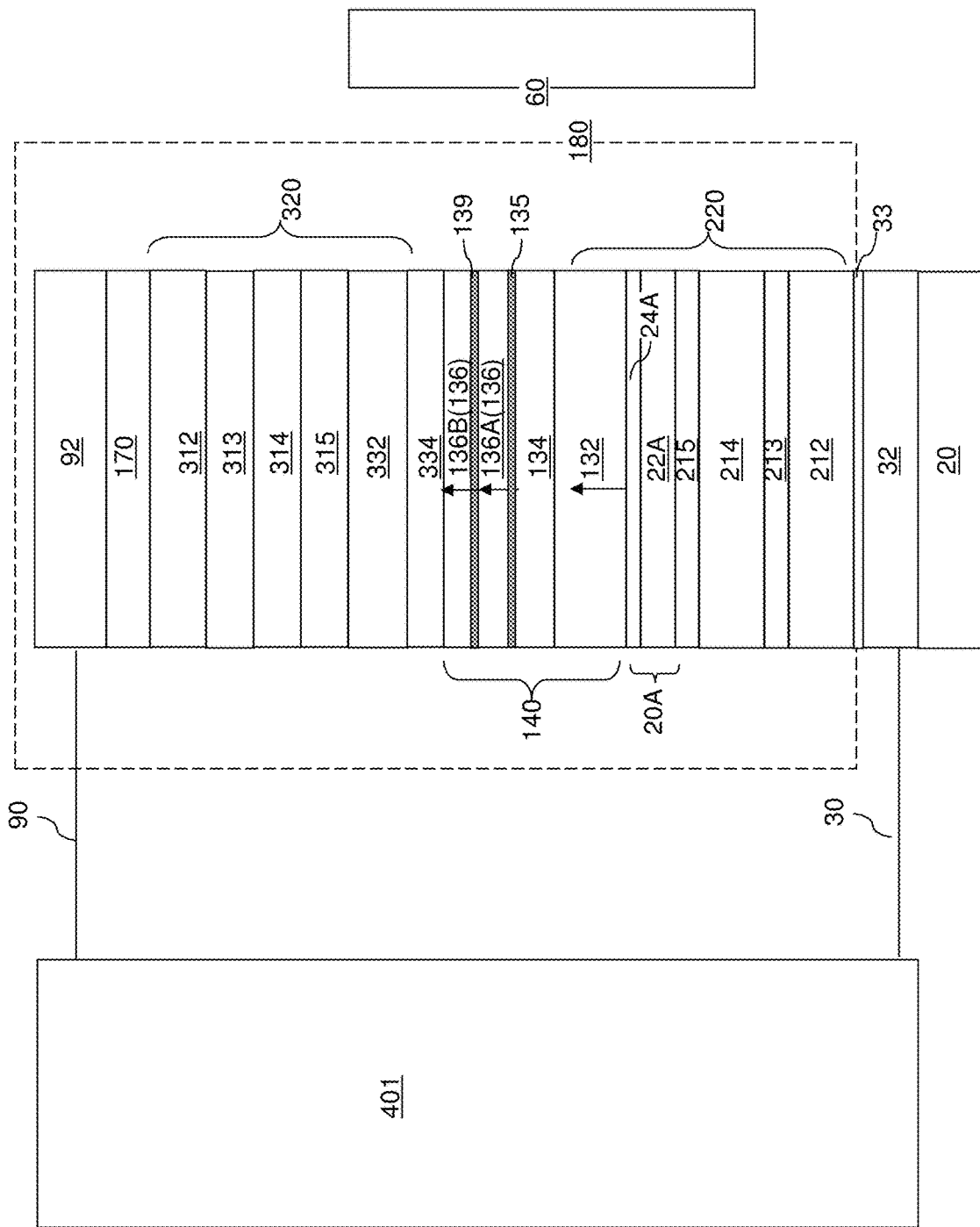
FIG. 11 illustrates a fourth configuration of the second exemplary VCMA memory device according to the second embodiment of the present disclosure.

Referring to FIG. 11, a fourth configuration of the second exemplary VCMA memory device may be derived from the third configuration of the second exemplary VCMA memory device of FIG. 10 by providing a second composite reference magnetization structure 320 between the dielectric capping layer 334 and the second electrode 92. The second composite reference magnetization structure 320 includes, along a direction from the dielectric capping layer 334 toward the second electrode 92, the second reference layer 332, a second nonmagnetic spacer metal layer 315, and a fixed vertical magnetization structure (314, 313, 312) configured to generate a fixed vertical magnetic field at an interface with the second nonmagnetic spacer metal layer 315. In other words, the second composite reference magnetization structure 320 can include, along a direction from the second electrode 92 toward the free layer 136, a fixed vertical magnetization structure (312, 313, 314) configured to generate a fixed vertical magnetic field at a planar end surface and a second nonmagnetic spacer metal layer 315. Generally, the second composite reference magnetization structure 320 may be the same as in the first exemplary VCMA memory device.

The sensing methods and the programming methods for the second exemplary VCMA memory device of the second embodiment may be the same as in the first embodiment.

The magnetoelectric memory device illustrated in FIGS. 8-11 can be manufactured by forming a layer stack including, from one side to another, a second electrode 32, a first reference layer 132, a nonmagnetic tunnel barrier layer 134, a combination of a first nonmagnetic metal dust layer 135 and a free layer 136 embedding a second nonmagnetic metal dust layer 139, a dielectric capping layer 348, and a second electrode 92 in a forward order or in a reverse order. A first composite reference magnetization structure 220 and/or a second composite reference magnetization structure 320 may, or may not, be employed. A control circuit 401 can be formed, and the second electrode 32 and the second electrode 92 can be connected to a respective node of the control circuit 401. The first reference layer 132 has a fixed magnetization direction, and the free layer 136 has magnetic anisotropy that provides magnetization directions that are parallel or antiparallel to the fixed magnetization direction.

Figure 12A:
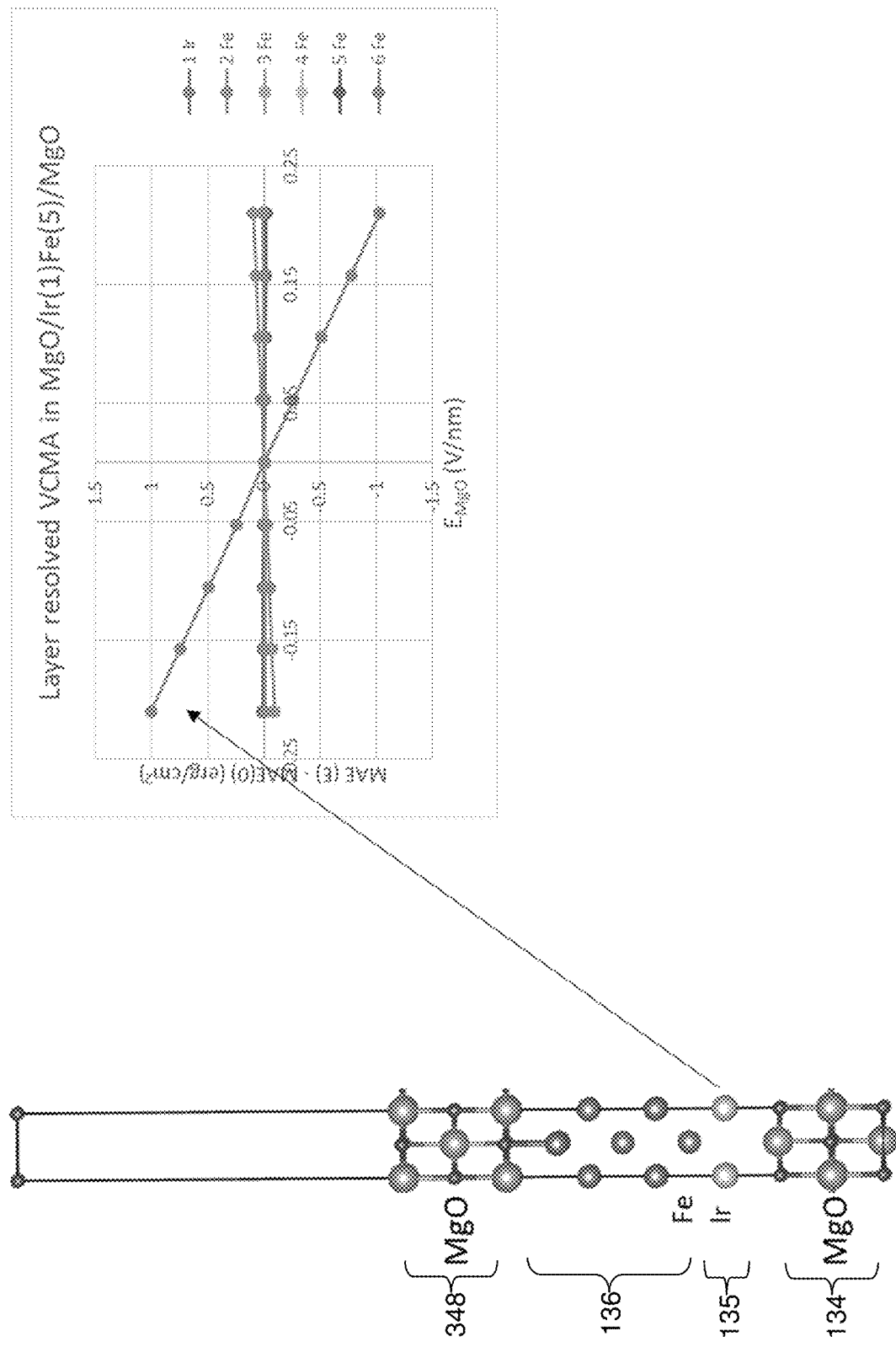
FIG. 12A is an atomic-level model and a graph for the magnetic anisotropy energy as a function of an applied electric field for a first comparative magnetic tunnel junction in a comparative exemplary VCMA device.

Referring to FIG. 12A, an atomic-level model for a magnetic tunnel junction and a graph for the magnetic anisotropy energy density as a function of an applied electric field are illustrated for a first comparative magnetic tunnel junction in a comparative exemplary VCMA device. The first comparative magnetic tunnel junction includes an iridium monolayer as the first nonmagnetic metal dust layer 135, Fe free layer 136, MgO tunneling barrier layer 134 and MgO dielectric capping layer 348. The second nonmagnetic metal dust layer 139 is omitted in order to quantify the effect of the presence of the first nonmagnetic metal dust layer 135 while the second nonmagnetic metal dust layer 139 is absent. Simulations were performed to determine the effect of the presence of the iridium layer as the first nonmagnetic metal dust layer 135 on the magnetic anisotropy energy of the structure, and a VCMA coefficient due to the presence of an iridium layer as the first nonmagnetic metal dust layer 135 was calculated. The value of the VCMA coefficient in this configuration was estimated to be about −3,050 fJ/V·m at zero degrees Kelvin.

Figure 12B:
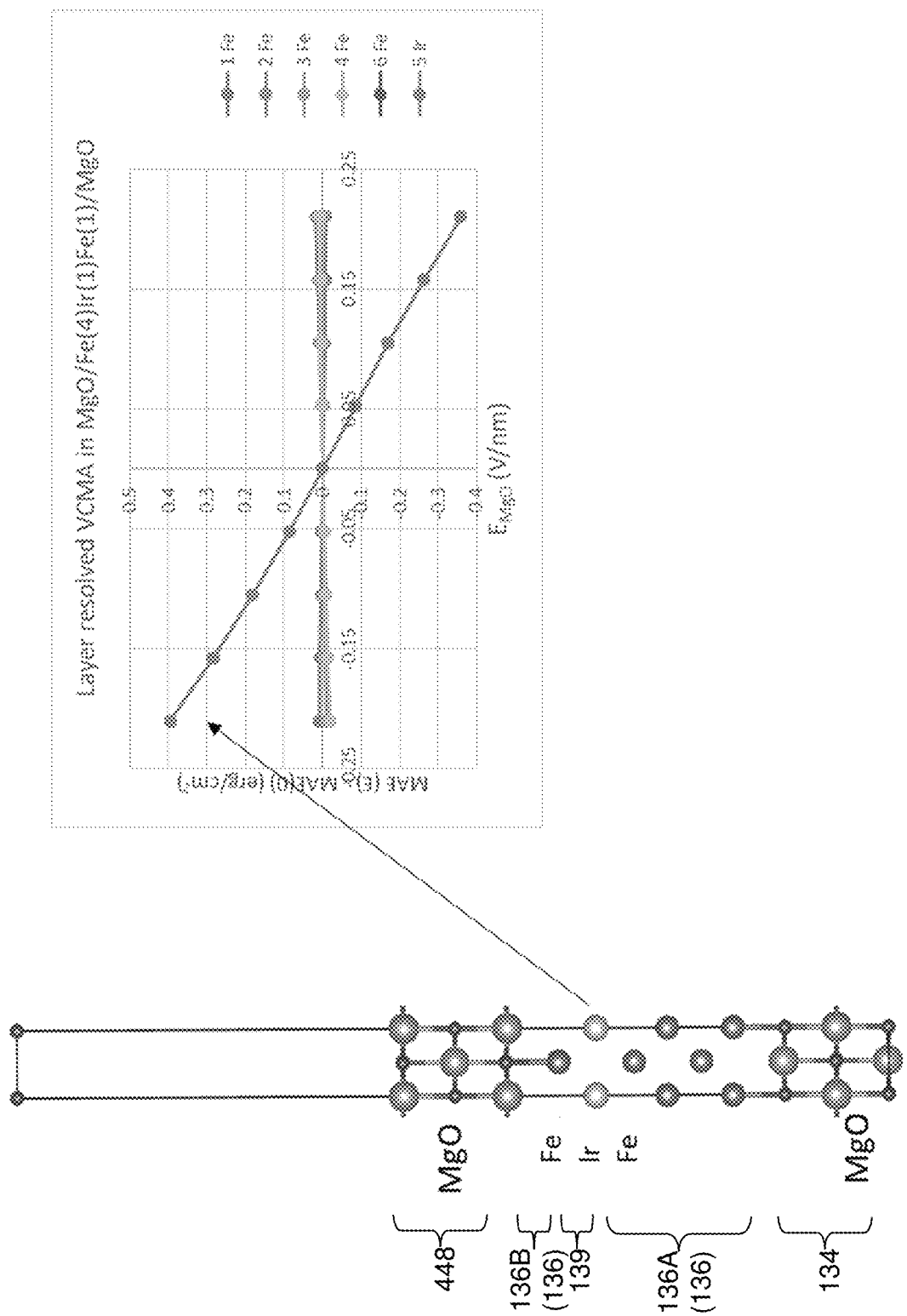
FIG. 12B is an atomic-level model and a graph for the magnetic anisotropy energy as a function of an applied electric field for a second comparative magnetic tunnel junction for a comparative exemplary VCMA device.

Referring to FIG. 12B, an atomic-level model for a magnetic tunnel junction and a graph for the magnetic anisotropy energy density as a function of an applied electric field are illustrated for a second comparative magnetic tunnel junction in a comparative exemplary VCMA device. The second comparative magnetic tunnel junction includes an iridium monolayer as the second nonmagnetic metal dust layer 139, an iron first component free layer 136A, a monolayer of iron as the second component free layer 136B, MgO tunneling barrier layer 134 and MgO dielectric capping layer 348. The first nonmagnetic metal dust layer 135 is omitted in order to quantify the effect of the presence of the second nonmagnetic metal dust layer 139 while the first nonmagnetic metal dust layer 135 is absent. Simulations were performed to determine the effect of the presence of the iridium layer as the second nonmagnetic metal dust layer 139 on the magnetic anisotropy energy of the structure, and a VCMA coefficient due to the presence of a iridium layer as the second nonmagnetic metal dust layer 139 was calculated. The value of the VCMA coefficient in this configuration was estimated to be about −920 fJ/V·m at zero degrees Kelvin. The value of the VCMA coefficient would be about positive 920 fJ/Vm if the second nonmagnetic metal dust layer 139 was instead placed within one monolayer of iron from the MgO tunneling barrier layer 134.

Figure 12C:
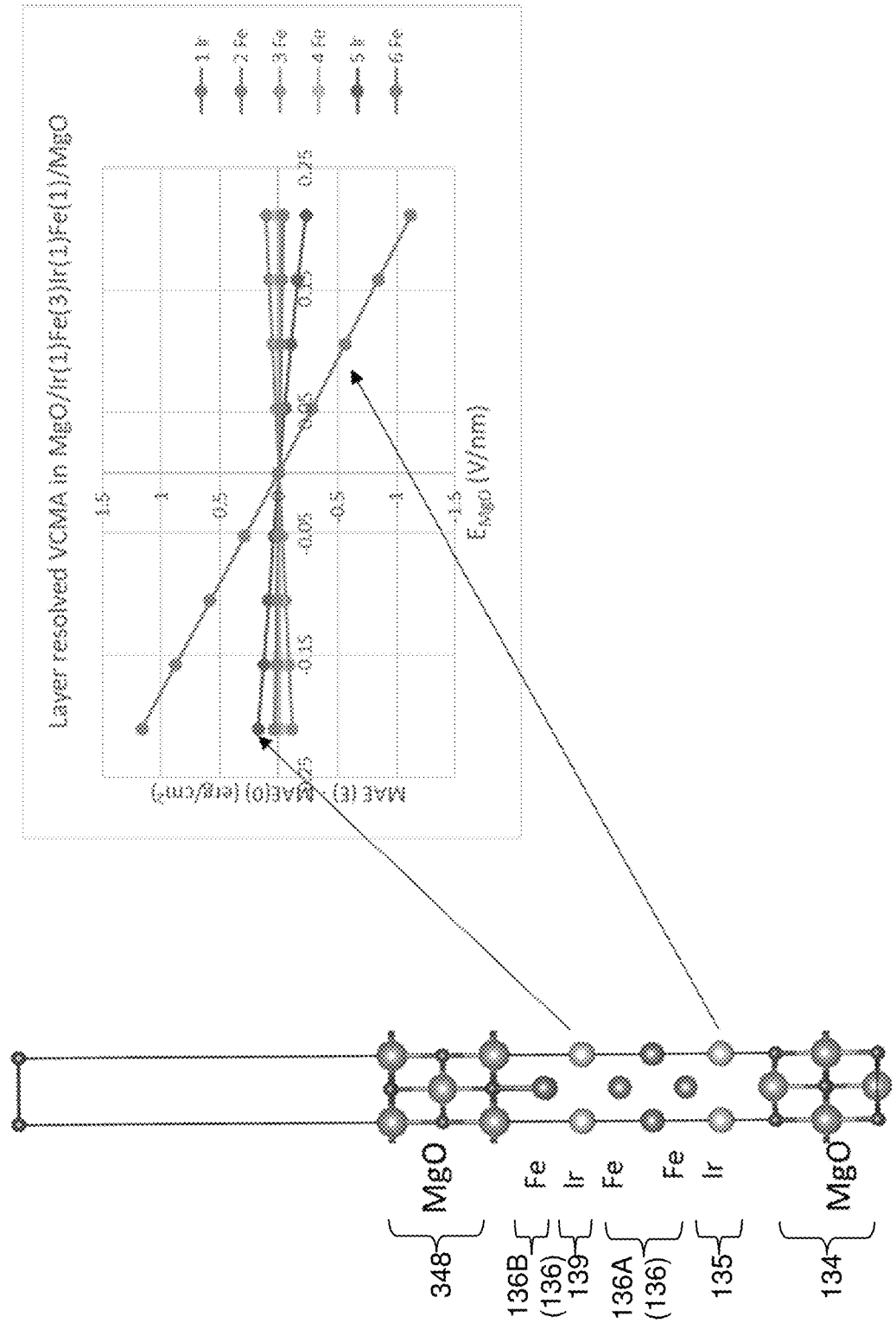
FIG. 12C is an atomic-level model and a graph for the magnetic anisotropy energy as a function of an applied electric field for the comparative magnetic tunnel junction for the second exemplary VCMA device.

Referring to FIG. 12C, an atomic-level model for a magnetic tunnel junction and a graph for the magnetic anisotropy energy density as a function of an applied electric field are illustrated for a magnetic tunnel junction in the first exemplary VCMA device of FIGS. 8-11. The magnetic tunnel junction includes an iridium monolayer as the first nonmagnetic metal dust layer 135, an iridium monolayer as the second nonmagnetic metal dust layer 139, an iron first component free layer 136A, a monolayer of iron as the second component free layer 136B, MgO tunneling barrier layer 134 and MgO dielectric capping layer 348. Thus, both the first nonmagnetic metal dust layer 135 and the second nonmagnetic metal dust layer 139 are present. Simulations were performed to determine the effect of the presence of the iridium monolayer as the first nonmagnetic metal dust layer 135 and the presence of the iridium layer as the second nonmagnetic metal dust layer 139 on the magnetic anisotropy energy of the structure. In this case, the total value of the VCMA coefficients due to the first nonmagnetic metal dust layer 135 and the second nonmagnetic metal dust layer 139 in this configuration was estimated to be about −3,750 fJ/Vm at zero degrees Kelvin. A higher total VCMA coefficient was obtained employing the configuration of the second exemplary VCMA memory device compared to the comparative exemplary devices of FIGS. 12A and 12B.

Generally, the first nonmagnetic metal dust layer 135 provides a first voltage-controlled magnetic anisotropy coefficient to the free layer 136; the second nonmagnetic metal dust layer 139 provides a second voltage-controlled magnetic anisotropy coefficient to the free layer 136; and an absolute magnitude of the second voltage-controlled magnetic anisotropy coefficient is at least 25% of an absolute magnitude of the first voltage-controlled magnetic anisotropy coefficient. In one embodiment, the first voltage-controlled magnetic anisotropy coefficient has an absolute magnitude greater than 2,400 fJ/V·m; and the second voltage-controlled magnetic anisotropy coefficient has absolute magnitude greater than 800 fJ/V·m at zero degrees Kelvin. The combination of the first nonmagnetic metal dust layer 135 and the second nonmagnetic metal dust layer 139 can provide a total VCMA coefficient having an absolute value above 3,000 fJ/V·m, such as 3,500 to 3750 fJ/V·m at zero degrees Kelvin.

Figure 13:
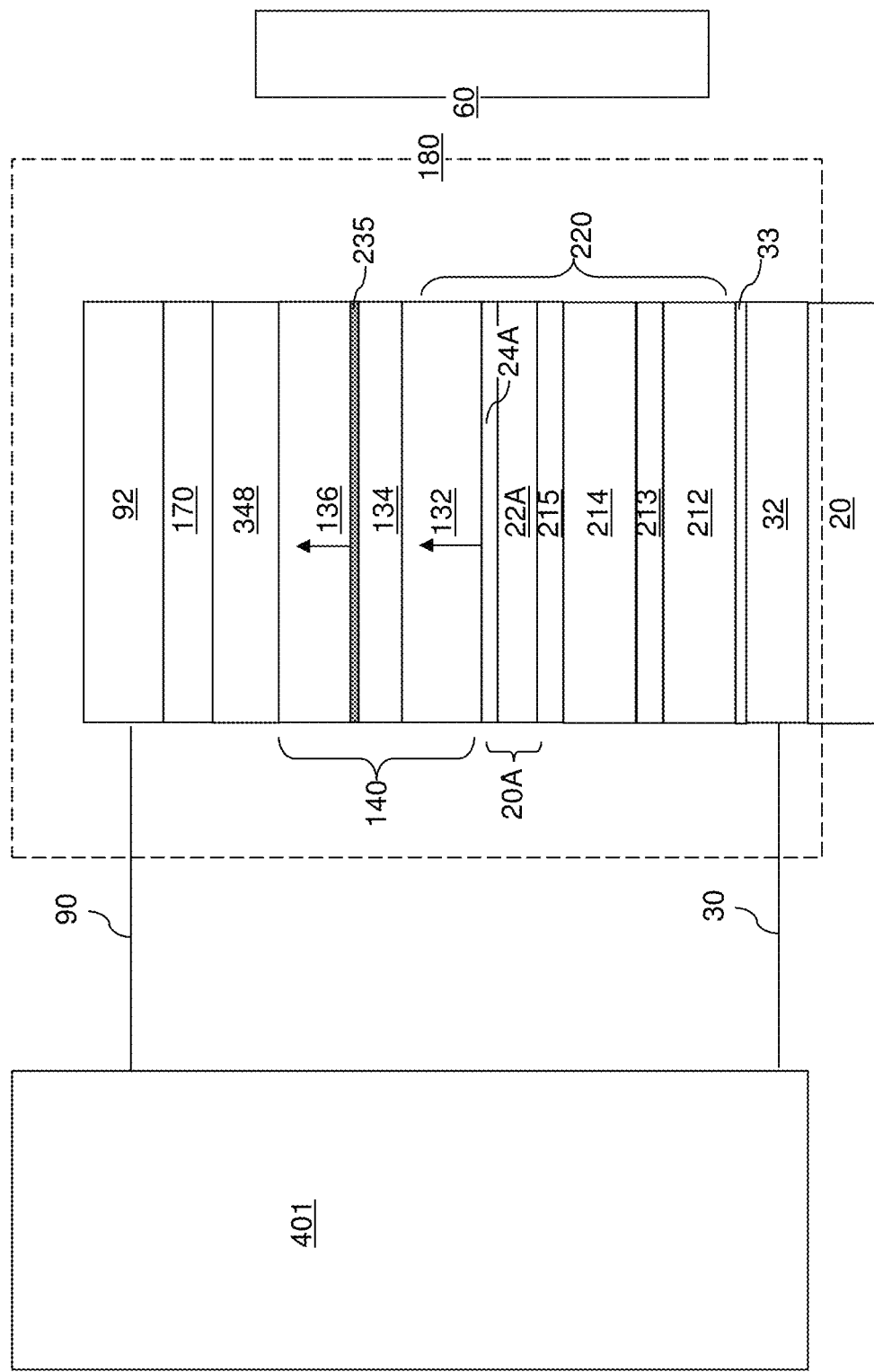
FIG. 13 illustrates a first configuration of a third exemplary VCMA memory device according to a third embodiment of the present disclosure.

Referring to FIG. 13, a first configuration of a third exemplary VCMA memory device according to a third embodiment of the present disclosure is illustrated, which can be derived from the first configuration of the first exemplary VCMA memory device by modifying the combination of the first nonmagnetic metal dust layer 135, the free layer 136, and the second nonmagnetic metal dust layer 137. Specifically, the combination of the first nonmagnetic metal dust layer 135, the free layer 136, and the second nonmagnetic metal dust layer 137 in the first exemplary VCMA memory device is replaced with a combination of a two-dimensional metal compound layer 235 and a free layer 136. As used herein, a two-dimensional metal compound refers to a two-dimensional compound of a metallic element and another element having a thickness in a range from 0.3 nm to 2 nm. In one embodiment, the two-dimensional metal compound layer 235 may include a two-dimensional compound of a nonmagnetic metallic element and a nonmetallic element having in-plane covalent bonding and out-of-plane van der Waals bonding. Alternatively, the two-dimensional metal compound layer 235 may comprise a metal oxide, such as iridium oxide having a rutile crystal structure which has a "traditional" metal oxide structure (similar to MgO) rather than having strong covalent bonds in plane and van der Waals interactions out of plane.

In the third exemplary structure, the two-dimensional metal compound layer 235 is located between and contacts each of the nonmagnetic tunnel barrier layer 134 and the free layer 136. The two-dimensional metal compound layer 235 provides an increased voltage-controlled magnetic anisotropy coefficient for the device with improved stability. In one embodiment, the two-dimensional metal compound layer 235 may have a thickness in a range from 0.3 nm to 2 nm.

In one embodiment, the nonmetallic element may be selected from oxygen, chlorine, sulfur, selenium, tellurium, or silicon. In this case, the two-dimensional metal compound layer 235 may comprise a crystalline metal oxide, a crystalline metal chloride, a crystalline metal sulfide, a crystalline metal selenide, a crystalline metal telluride, or a crystalline metal silicide. In one embodiment, the two-dimensional metal compound layer 235 may be single crystalline or polycrystalline such that the directions of two-dimensional periodicity are within a horizontal plane that is parallel to an interface with the nonmagnetic tunnel barrier layer 134. The two-dimensional metal compound layer may be electrically conductive or electrically insulating.

In one embodiment, the nonmagnetic metallic element is selected from a transition metal such as iridium, platinum, palladium, rhodium, or ruthenium. In this case, the two-dimensional compound of the nonmagnetic metallic element and the nonmetallic element may comprise a crystalline metal oxide, a crystalline metal chloride, a crystalline metal sulfide, a crystalline metal selenide, a crystalline metal telluride, or a crystalline metal silicide of a transition metal that is selected from iridium, platinum, palladium, rhodium, or ruthenium. Generally, the two-dimensional compound of the nonmagnetic metallic element and the nonmetallic element comprises a material that provides voltage-controlled magnetic anisotropy coefficient that is at least 1,000 fJ/V·m.

Generally, the two-dimensional metal compound layer 235 can be an electrically conductive metal compound material providing high in-plane electrical conductivity and a lower out-of-plane electrical conductivity. The two-dimensional metal compound layer 235 can provide a high VCMA coefficient without negatively impacting resistance-area (RA) product or tunneling magnetoresistance (TMR). Generally, two-dimensional materials provide strong covalent bonds in-plane and weak van der Waals interactions perpendicular to the plane.

In an illustrative example, the nonmagnetic metallic element may be iridium. Various iridium-based two-dimensional materials may be employed for the two-dimensional metal compound layer 235. Such iridium-based two-dimensional materials may be formed by depositing at least one atomic layer of iridium and inducing a reaction between the iridium atoms and the nonmetallic element or by depositing the iridium compound layer during the same step. Deposition methods include atomic layer deposition, reactive sputtering, chemical vapor deposition, pulsed laser ablation or mechanical exfoliation. For example, an atomic layer may be mechanically exfoliated from a corresponding three dimensional material formed from stacks of such atomic layers, such as mechanically exfoliating graphene (i.e., a single hexagonal sheet of carbon) from graphite, followed by positioning the atomic layer of graphene on a desired surface.

The strong covalent bonds in the iridium-based two-dimensional materials can help reduce iridium diffusion into the free layer 136 or into the nonmagnetic tunnel barrier layer 134. Low level of iridium diffusion increases the magnitude of the VCMA coefficients, and also increase the layer stability and long-term endurance (i.e., reliability) of the VCMA MeRAM material stacks.

Various iridium-based two-dimensional materials have high stability (high heat of formation, good dynamical stability) based on density functional calculations, and should stabilize iridium between the free layer 136 and the nonmagnetic tunnel barrier layer 134. In one embodiment, the two-dimensional metal compound layer 235 consists essentially of iridium oxide having a rutile structure, i.e., conductive rutile iridium oxide ($IrO_2$). In this case, the thickness of the two-dimensional metal compound layer 235 may be in a range from two atomic layers of rutile iridium oxide to five atomic layers of rutile iridium oxide. $IrO_2$ (which may also be written as $Ir_2O_4$) has a large formation energy of about −0.657 eV/atom to be stable in the magnetic tunnel junction 140. Alternative iridium-based two-dimensional materials with low formation energies include $Ir_2Cl_6$, $Ir_4S_8$, $Ir_4Se_8$, $Ir_4Te_8$, and $IrSi_2$.

Generally, two-dimensional materials based on any of iridium, platinum, palladium, rhodium, or ruthenium may be employed provided that such two-dimensional materials provide high stability (high heat of formation, good dynamical stability), which may be calculated based on density functional calculations. Such two-dimensional materials stabilize the transition metal element between the free layer 136 and the nonmetallic tunnel barrier layer 134.

In one embodiment, the atomic ratio of the nonmetallic element to the nonmagnetic metallic element is greater than 1, and may be in a range from 2 to 3. In one embodiment, the two-dimensional metal compound layer 235 consists essentially of a single nonmagnetic metallic element and a single nonmetallic element selected from oxygen, chlorine, sulfur, selenium, tellurium, or silicon.

In one embodiment, the thickness to dielectric constant ratio of the dielectric capping layer 348 is greater than a thickness to dielectric constant ratio of the nonmagnetic tunnel barrier layer 134 such that a potential difference across the dielectric capping layer 348 is greater than a potential different across the nonmagnetic tunnel barrier layer 134 during application of a voltage across the second electrode 92 and the first electrode 32.

Figure 14:
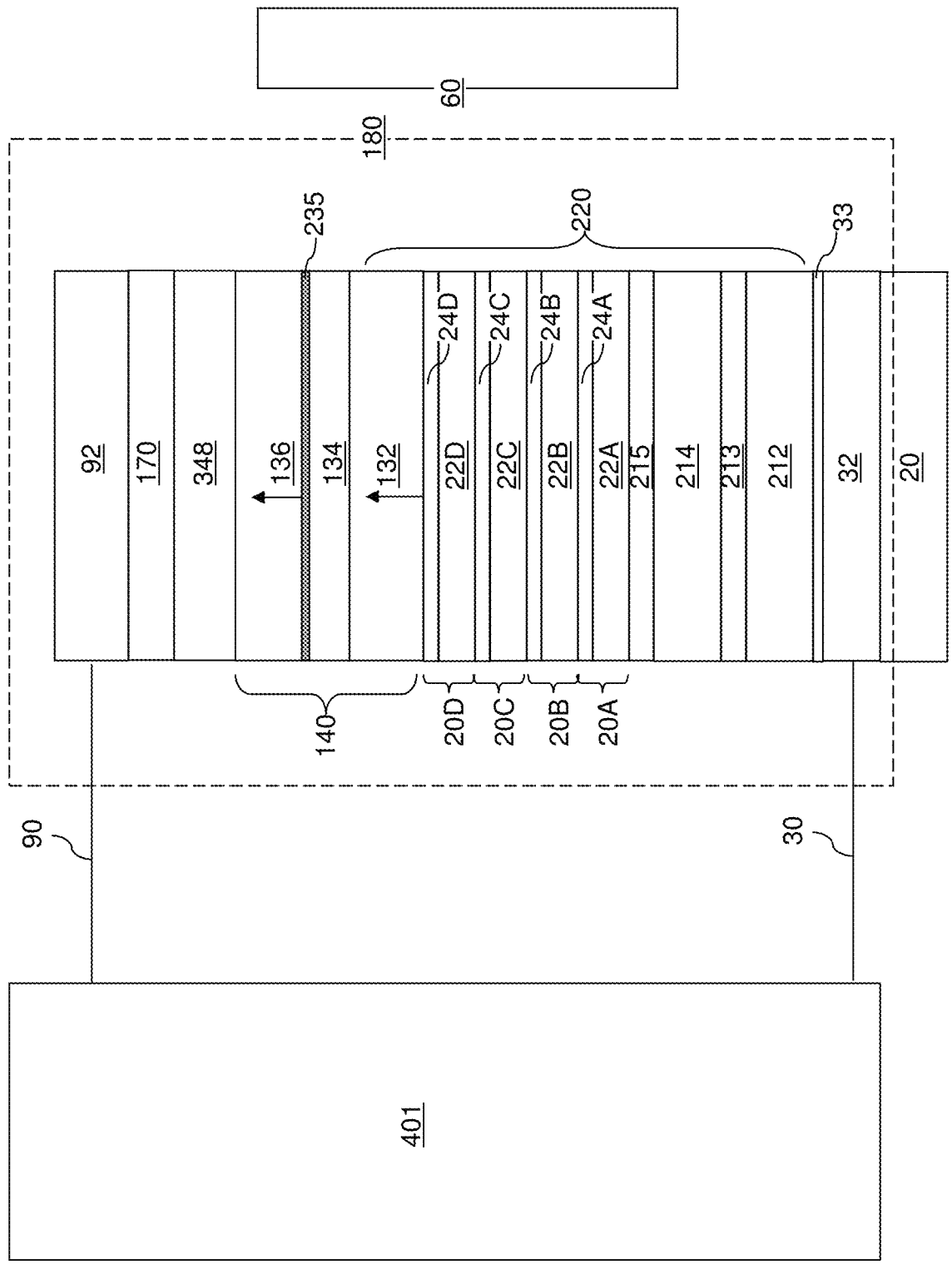
FIG. 14 illustrates a second configuration of the third exemplary VCMA memory device according to the third embodiment of the present disclosure.

Referring to FIG. 14, a second configuration of the third exemplary VCMA memory device can be derived from the first configuration of the third exemplary VCMA memory device of FIG. 13 by modifying the first composite reference magnetization structure 220. The first composite reference magnetization structure 220 is located between the second electrode 32 and the nonmagnetic tunnel barrier layer 134. The first composite reference magnetization structure 220 can include, along a direction from the second electrode 32 toward the second electrode 92, a fixed vertical magnetization structure (212, 213, 214) configured to generate a fixed vertical magnetic field at a planar end surface, a first nonmagnetic spacer metal layer 215, and the first reference layer 132. At least one first layer stack (20A, 20B, 20C, 20D) may be located between the first nonmagnetic spacer metal layer 215 and the first reference layer 132. The at least one first layer stack (20A, 20B, 20C, 20D) comprises a respective additional reference layer (22A, 22B, 22C, 22D) including a respective ferromagnetic material having perpendicular magnetic anisotropy, and a respective spacer dielectric metal oxide layer, such as a spacer dielectric metal oxide layer (24A, 24B, 24C, 24D). Generally, the first composite reference magnetization structure 220 may have the same structure as in the first exemplary VCMA memory device.

Figure 15:
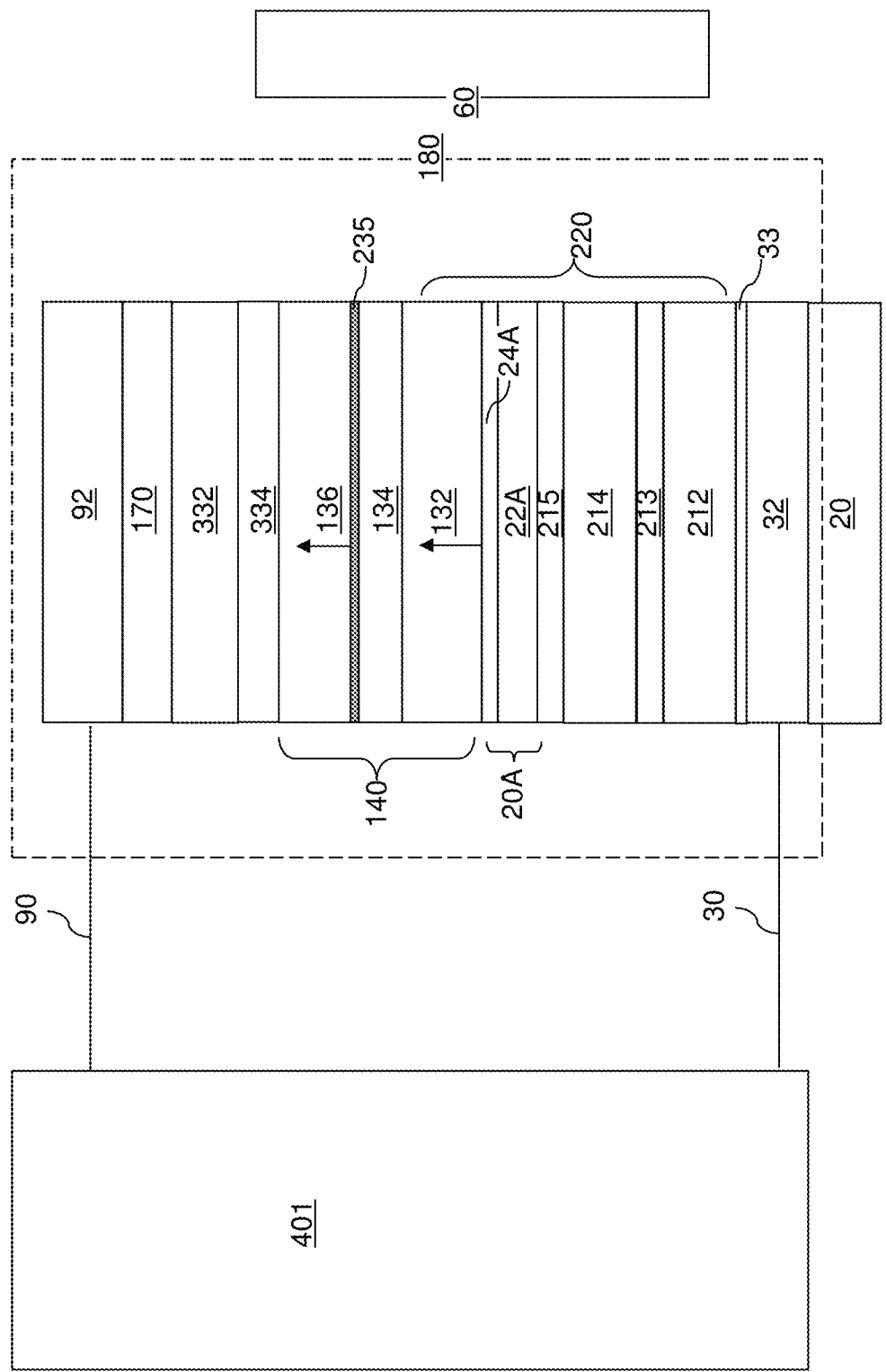
FIG. 15 illustrates a third configuration of the third exemplary VCMA memory device according to the third embodiment of the present disclosure.

Referring to FIG. 15, a third configuration of the third exemplary VCMA memory device may be derived from the first configuration or the second configuration of the third exemplary VCMA memory device illustrated in FIGS. 13 and 14 by inserting a second reference layer 332 between the dielectric capping layer 334 and the nonmagnetic metallic capping layer 170. The second reference layer 332 can be in contact with the dielectric capping layer 334, and can have the same magnetization direction as the first reference layer 132. In one embodiment, the second reference layer 332 can include any ferromagnetic material that may be employed for the first reference layer 132, and can have a thickness within the thickness range for the first reference layer 132. The second reference layer 332, if present, reinforces the reference magnetic field generated by the first reference layer 132.

Figure 16:
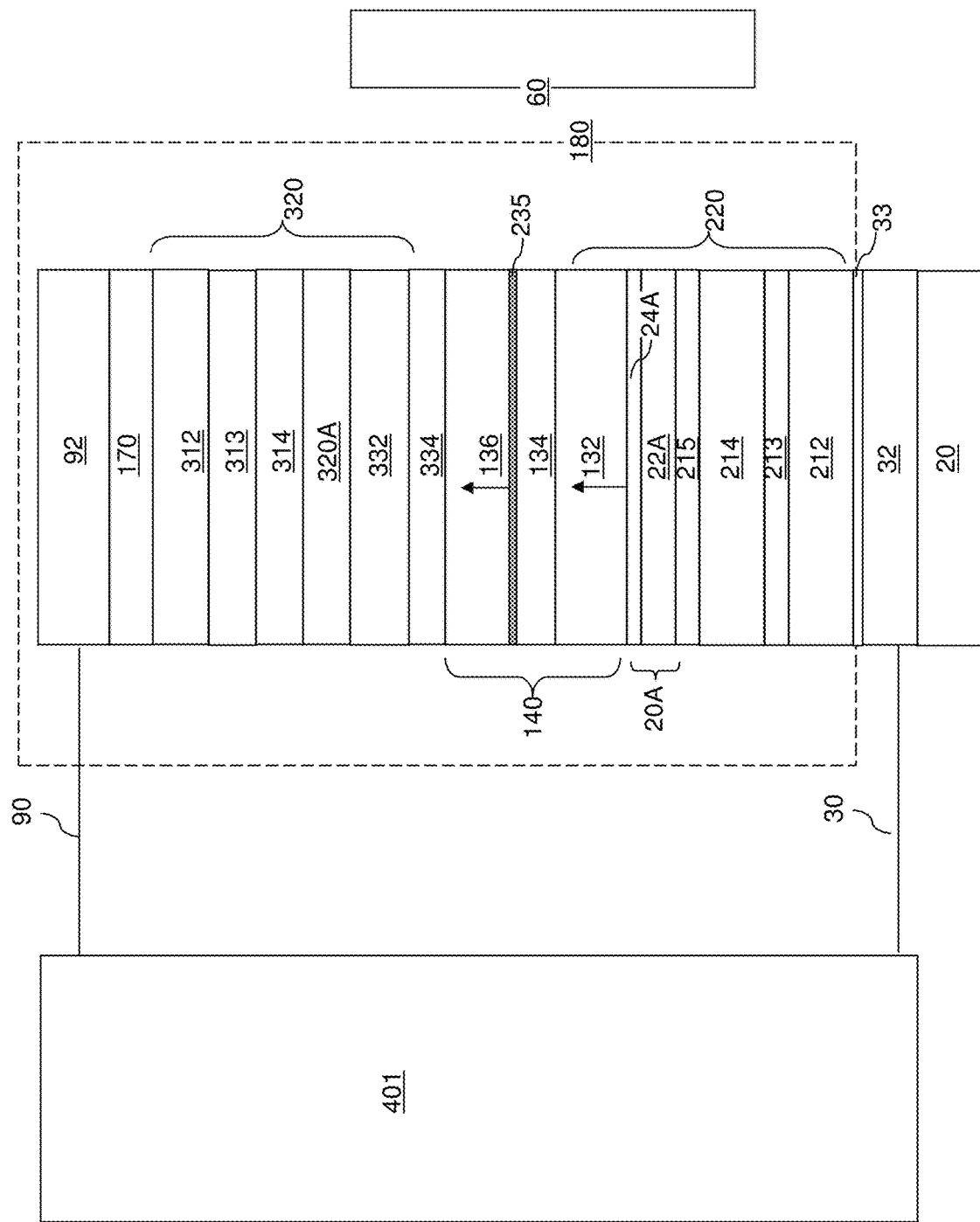
FIG. 16 illustrates a fourth configuration of the third exemplary VCMA memory device according to the third embodiment of the present disclosure.

Referring to FIG. 16, a fourth configuration of the third exemplary VCMA memory device may be derived from the third configuration of the third exemplary VCMA memory device by providing a second composite reference magnetization structure 320 between the dielectric capping layer 334 and the second electrode 92. The second composite reference magnetization structure 320 includes, along a direction from the dielectric capping layer 334 toward the second electrode 92, the second reference layer 332, a second nonmagnetic spacer metal layer 315, and a fixed vertical magnetization structure (314, 313, 312) configured to generate a fixed vertical magnetic field at an interface with the second nonmagnetic spacer metal layer 315. In other words, the second composite reference magnetization structure 320 can include, along a direction from the second electrode 92 toward the free layer 136, a fixed vertical magnetization structure (312, 313, 314) configured to generate a fixed vertical magnetic field at a planar end surface and a second nonmagnetic spacer metal layer 315. Generally, the second composite reference magnetization structure 320 may be the same as in the first exemplary VCMA memory device.

The sensing methods and the programming methods for the third exemplary VCMA memory device of the third embodiment may be the same as in the first embodiment.

Figure 17:
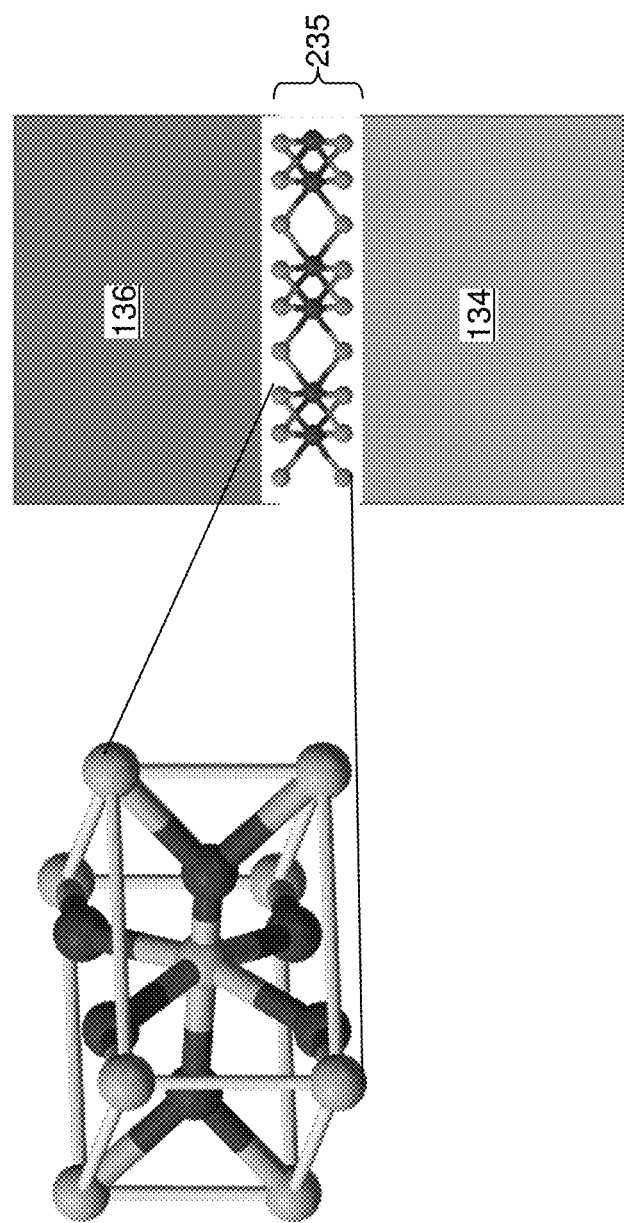
FIG. 17 is perspective view of an atomic model of a two-dimensional metal compound layer including a compound of a nonmagnetic metallic element in a magnetic tunnel junction in the third exemplary VCMA memory device.

FIG. 17 is perspective view of an atomic model of a two-dimensional metal compound layer 235 including a compound of a nonmagnetic metallic element in a magnetic tunnel junction in the third exemplary VCMA memory device. The two-dimensional metal compound layer 235 includes conductive $IrO_2$ material have a rutile structure.

In one embodiment, the two-dimensional metal compound layer 235 of the third embodiment may be used instead of the first metal dust layer 135 in the MeRAM devices of the first and second embodiments. In other words, the iridium metal dust layer 135 is replaced by an iridium compound layer 235, such as iridium oxide.

Figure 18:
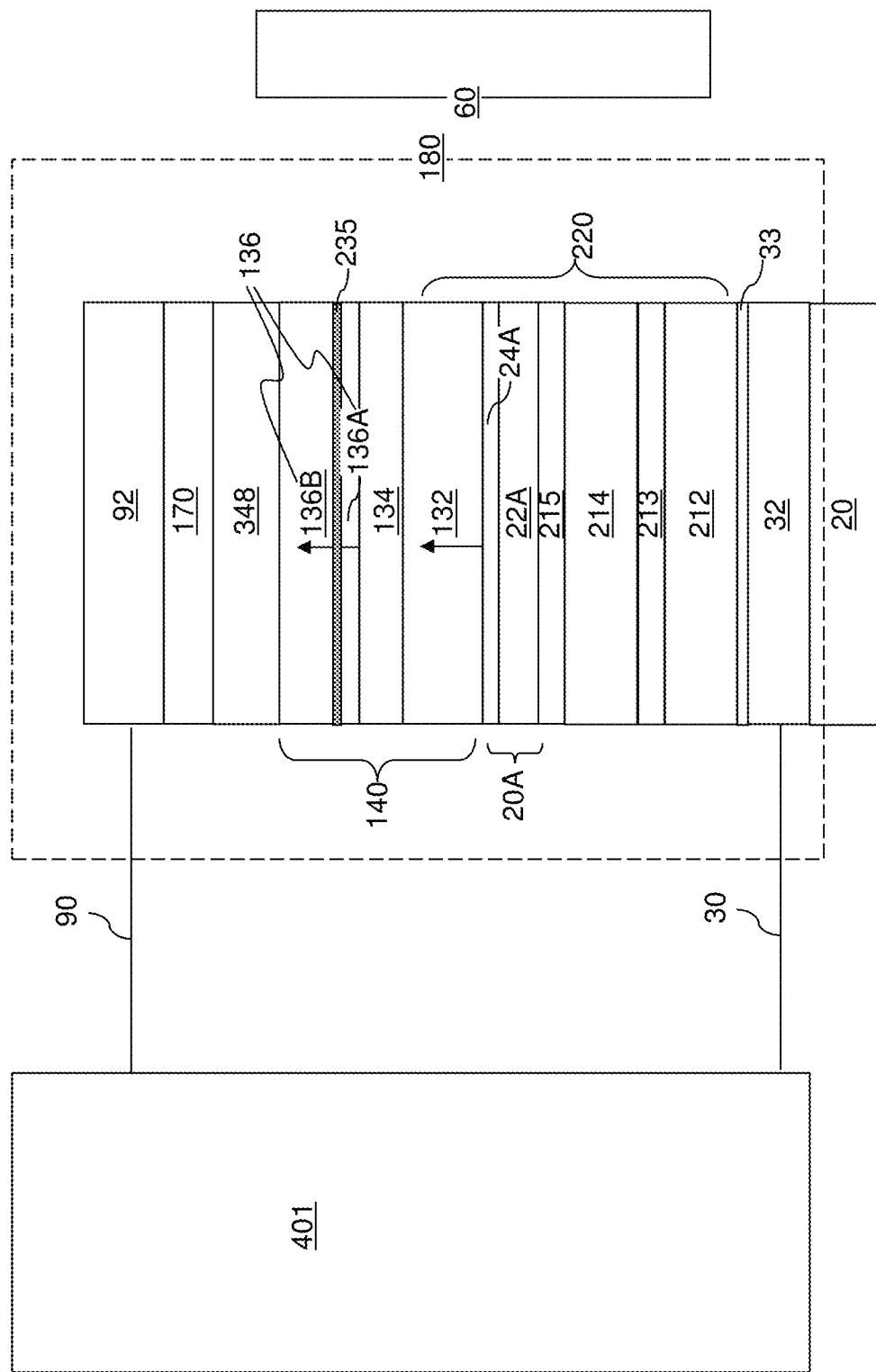
FIG. 18 illustrates a first configuration of a fourth exemplary VCMA memory device according to a fourth embodiment of the present disclosure.

Referring to FIG. 18, a first configuration of a fourth exemplary VCMA memory device according to a fourth embodiment of the present disclosure is illustrated, which can be derived from the first configuration of the third exemplary VCMA memory device by modifying the combination of the two-dimensional metal compound layer 235 and the free layer 136. Specifically, the combination of the two-dimensional metal compound layer 235 and the free layer 136 in the third exemplary VCMA memory device is replaced with a combination of a first component free layer 136A, the two-dimensional metal compound layer 235, and a second component free layer 136B. Thus, the two-dimensional metal compound layer 235 is embedded in the free layer 136.

The two-dimensional metal compound layer 235 includes a two-dimensional compound of a nonmagnetic metallic element and a nonmetallic element having in-plane covalent bonding and out-of-plane van der Waals bonding as in the third exemplary VCMA memory device. The two-dimensional metal compound layer 235 is embedded within the free layer 136, which includes the first component free layer 136A and the second component free layer 136B. The two-dimensional metal compound layer 235 contacts the first component free layer 136A and the second component free layer 136B. In one embodiment, the two-dimensional metal compound layer 235 may be more proximal to the nonmagnetic tunnel dielectric layer 134 than to the dielectric capping layer 348. In one embodiment, the two-dimensional metal compound layer 235 may have a thickness in a range from 0.3 nm to 2 nm.

Generally, the material composition and the thickness of the two-dimensional metal compound layer 235 may be the same as in the third VCMA memory device. Each of the first component free layer 136A and the second component free layer 136B may have a respective material composition that may be any of the material compositions of the free layer 136.

Figure 19:
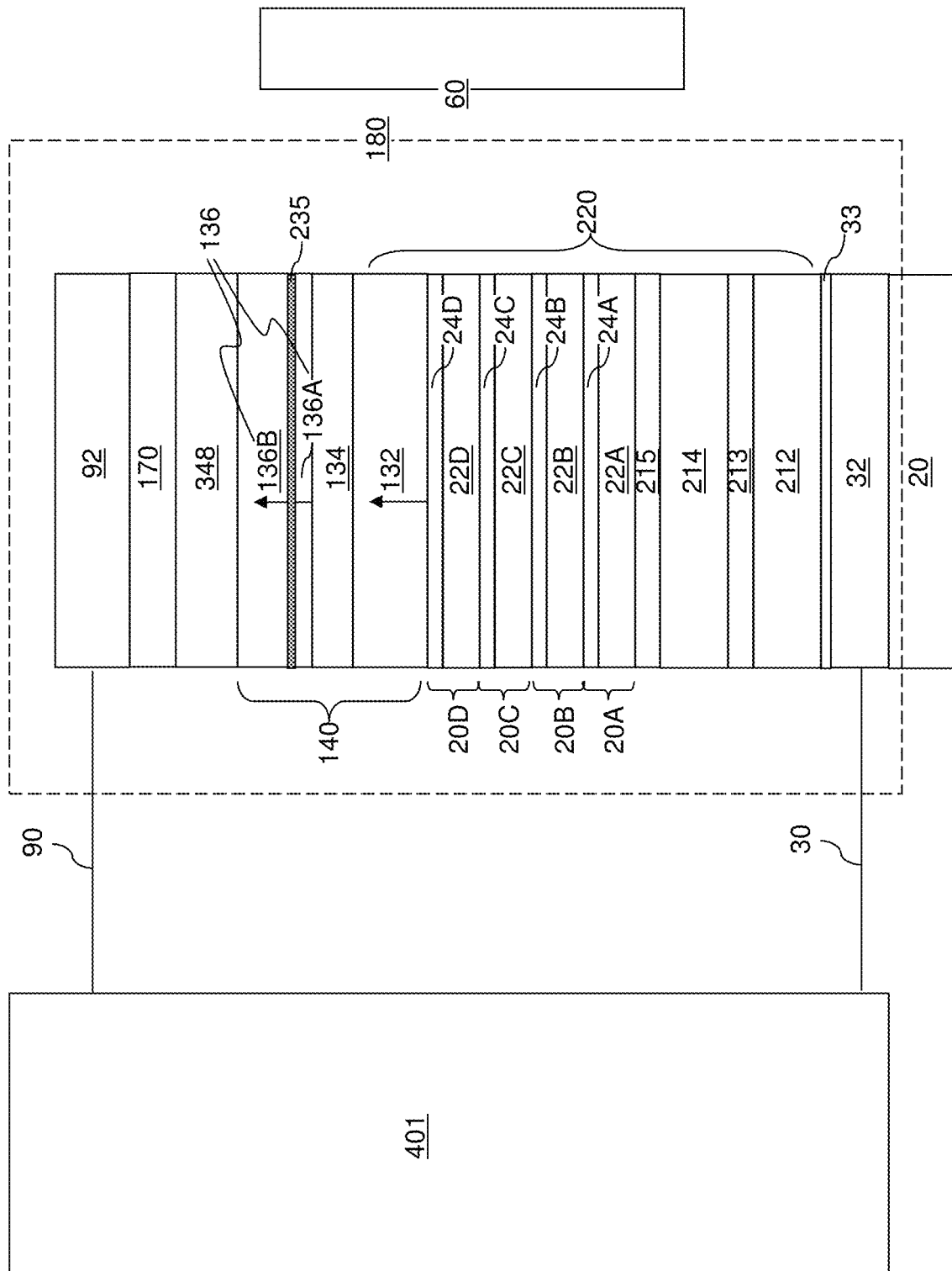
FIG. 19 illustrates a second configuration of the fourth exemplary VCMA memory device according to the fourth embodiment of the present disclosure.

Referring to FIG. 19, a second configuration of the fourth exemplary VCMA memory device can be derived from the first configuration of the fourth exemplary VCMA memory device of FIG. 18 by modifying the first composite reference magnetization structure 220 in the same manner as in the second configuration of the third exemplary VCMA memory device.

Figure 20:
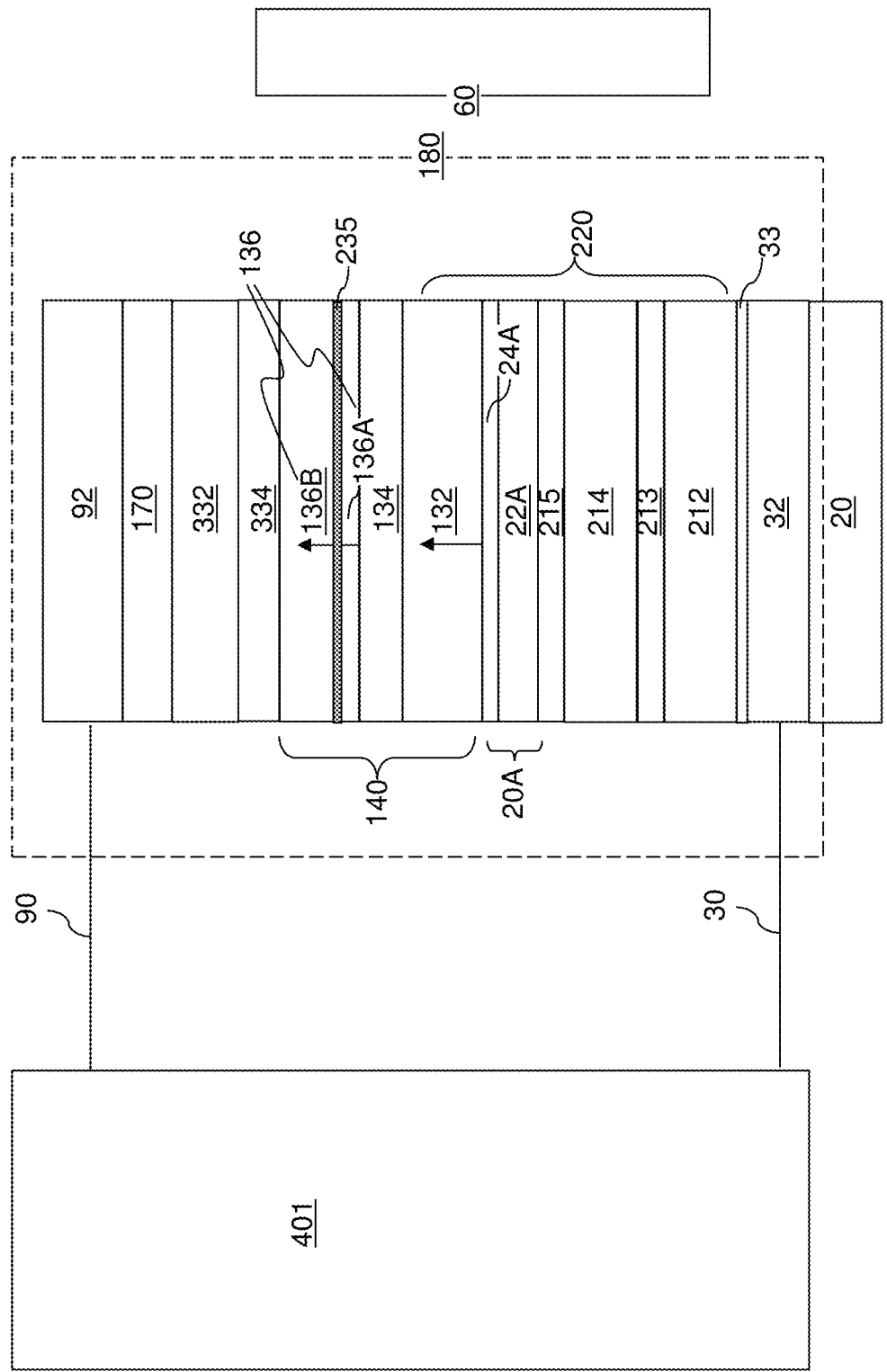
FIG. 20 illustrates a third configuration of the fourth exemplary VCMA memory device according to the fourth embodiment of the present disclosure.

Referring to FIG. 20, a third configuration of the third exemplary VCMA memory device may be derived from the first configuration or the second configuration of the fourth exemplary VCMA memory device of FIG. 18 or 19 by inserting a second reference layer 332 between the dielectric capping layer 334 and the nonmagnetic metallic capping layer 170.

Figure 21:
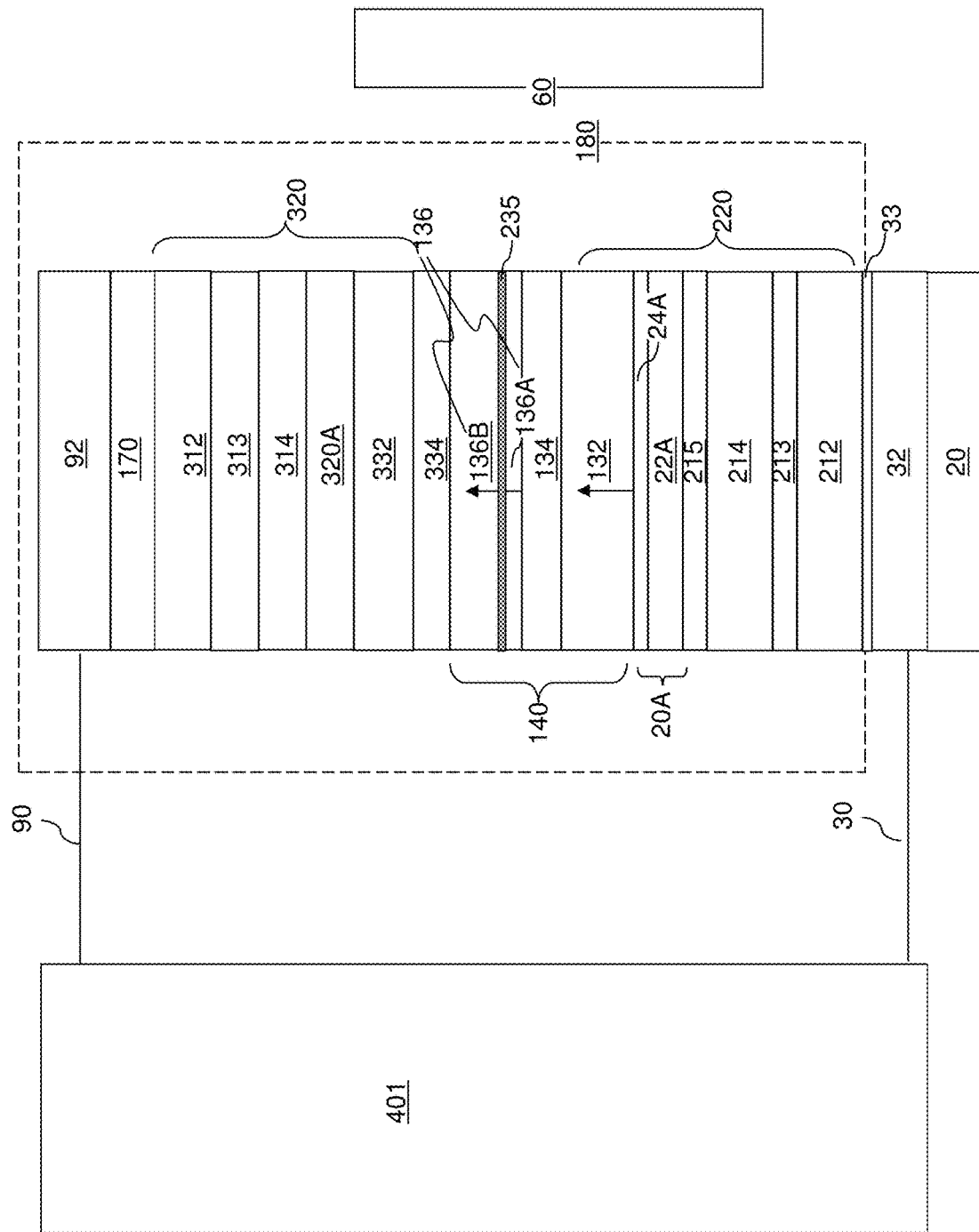
FIG. 21 illustrates a fourth configuration of the fourth exemplary VCMA memory device according to the fourth embodiment of the present disclosure.

Referring to FIG. 21, a fourth configuration of the fourth exemplary VCMA memory device may be derived from the third configuration of the fourth exemplary VCMA memory device by providing a second composite reference magnetization structure 320 between the dielectric capping layer 334 and the second electrode 92 in the same manner as in the fourth configuration of the third exemplary VCMA memory device.

In one embodiment, the two-dimensional metal compound layer 235 of the fourth embodiment may be used instead of the second metal dust layer 139 in the MeRAM devices of the second embodiment. In other words, the iridium metal dust layer 139 is replaced by an iridium compound layer 235, such as iridium oxide.

In various embodiments of the present disclosure, each of the nonmagnetic tunnel barrier layer and the dielectric capping layer comprises a respective material selected from magnesium oxide, aluminum oxide, a spinel material or a ferroelectric metal oxide material, such as non-centrosymmetric orthorhombic phase of hafnium oxide which may be doped with Zr, Al or Si, $SrTiO_3$, $PbTiO_3$, $BiFeO_3$, etc.

The various embodiments of the present disclosure can be employed to provide a VCMA memory device having a high total VCMA coefficient. The high VCMA coefficient enables operation of the VCMA memory device at a lower operating voltage both for the sensing operation and the programming operation, and increases the endurance and reliability of the VCMA memory device while reducing power consumption of the VCMA memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A magnetoelectric memory device, comprising:
a first electrode;
a second electrode; and
a magnetic tunnel junction located between the first electrode and the second electrode, the magnetic tunnel junction comprising, along a direction from the first electrode toward the second electrode, a first reference layer, a nonmagnetic tunnel barrier layer, and a free layer; and
a dielectric capping layer located between the magnetic tunnel junction and the second electrode,
wherein a two-dimensional metal compound layer including a two-dimensional compound of a nonmagnetic metallic element and a nonmetallic element is embedded within the free layer or is located between the nonmagnetic tunnel barrier layer and the free layer.

2. The memory device of claim 1, wherein:
the nonmetallic element is selected from oxygen, chlorine, sulfur, selenium, tellurium, or silicon; and
the nonmagnetic metallic element is selected from iridium, platinum, palladium, rhodium, or ruthenium.

3. The memory device of claim 2, wherein the nonmagnetic metallic element is iridium.

4. The memory device of claim 3, wherein the two-dimensional metal compound layer consists essentially of iridium oxide having a rutile structure.

5. The memory device of claim 1, wherein an atomic ratio of the nonmetallic element to the nonmagnetic metallic element is greater than 1.

6. The memory device of claim 1, wherein the two-dimensional metal compound layer has in-plane covalent bonding and out-of-plane van der Waals bonding.

7. The memory device of claim 1, wherein the two-dimensional metal compound layer contacts the nonmagnetic tunnel barrier layer and the free layer.

8. The memory device of claim 1, wherein the free layer comprises:
a first component free layer in contact with the nonmagnetic tunnel barrier layer and the two-dimensional metal compound layer; and
a second component free layer in contact with the two-dimensional metal compound layer and the dielectric capping layer.

9. The memory device of claim 1, wherein the two-dimensional metal compound layer consists essentially of a single nonmagnetic metallic element and a single nonmetallic element selected from oxygen, chlorine, sulfur, selenium, tellurium, and silicon.

10. The memory device of claim 1, wherein a thickness to dielectric constant ratio of the dielectric capping layer is greater than a thickness to dielectric constant ratio of the nonmagnetic tunnel barrier layer, and wherein the magnetoelectric memory device comprises a voltage-controlled magnetic anisotropy memory device.

11. The memory device of claim 1, further comprising a nonmagnetic metallic capping layer contacting the dielectric capping layer and the second electrode.

12. The memory device of claim 1, further comprising a first composite reference magnetization structure located between the first electrode and the nonmagnetic tunnel barrier layer and including, along a direction from the first electrode toward the second electrode, a fixed vertical magnetization structure configured to generate a fixed vertical magnetic field at a planar end surface, a first nonmagnetic spacer metal layer located at the planar end surface, and the first reference layer.

13. The memory device of claim 12, wherein the a fixed vertical magnetization structure comprises a composite synthetic antiferromagnet (SAF) structure including a first superlattice, a second superlattice, and an antiferromagnetic coupling layer having a thickness that provides antiferromagnetic coupling between the first superlattice and the second superlattice, wherein the first superlattice comprises a first superlattice of first ferromagnetic layers and first nonferromagnetic layers, and the second superlattice comprises a second superlattice of second ferromagnetic layers and second nonferromagnetic layers.

14. The memory device of claim 1, further comprising a second reference layer in contact with the dielectric capping layer and having a same magnetization direction as the first reference layer.

15. The memory device of claim 1, wherein the two-dimensional metal compound layer is embedded within the free layer.

16. The memory device of claim 1, wherein the two-dimensional metal compound layer is located between the nonmagnetic tunnel barrier layer and the free layer.

17. The memory device of claim 16, further comprising a second two-dimensional metal compound layer embedded within the free layer and including a two-dimensional compound of a nonmagnetic metallic element and a nonmetallic element having in-plane covalent bonding and out-of-plane van der Waals bonding.

18. The memory device of claim 1, wherein the two-dimensional metal compound layer has a thickness in a range from 0.3 nm to 2 nm.

19. The memory device of claim 1, further comprising a control circuit configured:
- to perform a sensing operation that determines a magnetization state of the free layer by applying a sense voltage across the second electrode and the first electrode and by measuring magnetoresistance of the magnetic tunnel junction;
- to perform a comparison operation that determines whether the magnetization state of the free layer is at a target magnetization state selected from an upward-pointing magnetization state and a downward-pointing magnetization state; and
- to apply a programming pulse across the second electrode and the first electrode only if the magnetization state of the free layer is not the target magnetization state, and not to apply the programming pulse if the magnetization state of the free layer is the target magnetization state.

20. The memory device of claim 1, wherein the programming pulse has a same polarity for programming the upward-pointing magnetization state into the downward-pointing magnetization state and for programming the downward-pointing magnetization state into the upward-pointing magnetization state.

* * * * *